(12) United States Patent
Wang et al.

(10) Patent No.: US 10,276,799 B2
(45) Date of Patent: Apr. 30, 2019

(54) WHITE-LIGHT HYPERBRANCHED CONJUGATED POLYMER, METHOD FOR PREPARING THE SAME AND IT'S USE

(71) Applicant: TAIYUAN UNIVERSITY OF TECHNOLOGY, Taiyuan, Shanxi Province (CN)

(72) Inventors: Hua Wang, Taiyuan (CN); Jing Sun, Taiyuan (CN); Jie Li, Taiyuan (CN); Yuling Wu, Taiyuan (CN); Junli Yang, Taiyuan (CN); Xuguang Liu, Taiyuan (CN); Husheng Jia, Taiyuan (CN); Bingshe Xu, Taiyuan (CN); Wei Huang, Taiyuan (CN)

(73) Assignee: TAIYUAN UNIVERSITY OF TECHNOLOGY, Taiyuan, Shanxi Province (CN)

( * ) Notice: Subject to any disclaimer, the term of this patent is extended or adjusted under 35 U.S.C. 154(b) by 0 days.

(21) Appl. No.: 15/523,514

(22) PCT Filed: Jan. 23, 2015

(86) PCT No.: PCT/CN2015/071416
§ 371 (c)(1),
(2) Date: May 1, 2017

(87) PCT Pub. No.: WO2016/115726
PCT Pub. Date: Jul. 28, 2016

(65) Prior Publication Data
US 2017/0309826 A1  Oct. 26, 2017

(51) Int. Cl.
*C08G 61/02* (2006.01)
*C08G 61/10* (2006.01)
*C08G 83/00* (2006.01)
*C09K 11/06* (2006.01)
*H01L 51/00* (2006.01)
*H01L 51/50* (2006.01)
*H05B 33/14* (2006.01)

(52) U.S. Cl.
CPC .......... *H01L 51/0039* (2013.01); *C08G 61/02* (2013.01); *C08G 61/10* (2013.01); *C08G 83/005* (2013.01); *C09K 11/06* (2013.01); *H01L 51/0085* (2013.01); *C08G 2261/11* (2013.01); *C08G 2261/12* (2013.01); *C08G 2261/132* (2013.01); *C08G 2261/149* (2013.01); *C08G 2261/1412* (2013.01); *C08G 2261/1624* (2013.01); *C08G 2261/1646* (2013.01); *C08G 2261/18* (2013.01); *C08G 2261/3142* (2013.01); *C08G 2261/374* (2013.01); *C08G 2261/411* (2013.01); *C08G 2261/5222* (2013.01); *C08G 2261/5242* (2013.01); *C08G 2261/60* (2013.01); *C08G 2261/95* (2013.01); *C09K 2211/1416* (2013.01); *C09K 2211/1425* (2013.01); *C09K 2211/1466* (2013.01); *C09K 2211/185* (2013.01); *H01L 51/5012* (2013.01); *H01L 51/5016* (2013.01); *H01L 2251/5376* (2013.01); *H05B 33/14* (2013.01); *Y02B 20/181* (2013.01)

(58) Field of Classification Search
CPC ............ C09K 11/06; C08G 2261/3142; C08G 2261/374
See application file for complete search history.

(56) References Cited

U.S. PATENT DOCUMENTS

| | | | | |
|---|---|---|---|---|
| 9,728,732 B2* | 8/2017 | Humphries | ......... | H01L 51/0085 |
| 2002/0013451 A1* | 1/2002 | Huang | ................ | H01L 51/0035 528/397 |
| 2003/0224208 A1* | 12/2003 | Kamatani | .............. | C09K 11/06 428/690 |
| 2004/0137263 A1* | 7/2004 | Burn | .................... | C07F 15/0033 428/690 |
| 2006/0119254 A1* | 6/2006 | Samuel | ................ | C07F 15/0033 313/504 |
| 2006/0127696 A1* | 6/2006 | Stossel | ................ | C07F 15/0033 428/690 |

(Continued)

FOREIGN PATENT DOCUMENTS

| CN | 1852933 A | 10/2006 |
|---|---|---|
| CN | 101125913 A | 2/2008 |

(Continued)

OTHER PUBLICATIONS

Guo et al. (Polym. Chem., 2011, 2, 2193-2203) (Year: 2011).*

(Continued)

*Primary Examiner* — Liam J Heincer
(74) *Attorney, Agent, or Firm* — United IP Counselors, LLC

(57) ABSTRACT

This application discloses a white-light hyperbranched conjugated polymer, a method for preparing the same and its use. The polymer uses a red phosphorescent Ir(III) complex as a core and polyfluorene derivative blue fluorescent materials as a framework which either contains or does not contain carbazole derivatives, and the white light hyperbranched polymers realize white-light emission by adjusting the content of the red phosphorescent Ir(III) complex connected using the complementation of blue and red color. The electroluminescent spectrum of the conjugated polymer in the present application covers the whole visible light emission area and is close to the pure white light emission, by which the conjugated polymer could be used as a material used in light-emitting layer to prepare the organic electroluminescent devices.

15 Claims, 6 Drawing Sheets

(56) References Cited

U.S. PATENT DOCUMENTS

| | | | | |
|---|---|---|---|---|
| 2006/0280964 | A1* | 12/2006 | Liu | C09K 11/06 428/690 |
| 2007/0231598 | A1* | 10/2007 | Busing | C08G 61/00 428/690 |
| 2007/0281182 | A1* | 12/2007 | Schulte | C08G 61/02 428/690 |
| 2008/0161567 | A1* | 7/2008 | Stoessel | C07F 15/0033 546/10 |
| 2008/0211391 | A1* | 9/2008 | Burn | C07F 15/0033 313/504 |
| 2009/0072722 | A1* | 3/2009 | Dowling | C09K 11/06 313/504 |
| 2009/0314957 | A1* | 12/2009 | Burn | C08G 83/002 250/459.1 |
| 2009/0315454 | A1* | 12/2009 | Igarashi | C07F 15/0033 313/504 |
| 2010/0072886 | A1* | 3/2010 | Burn | C07F 15/0033 313/504 |
| 2010/0084970 | A1* | 4/2010 | Choi | C07F 15/0033 313/504 |
| 2010/0171100 | A1* | 7/2010 | Nakatani | C08G 61/12 257/40 |
| 2011/0171448 | A1* | 7/2011 | Tang | C08G 73/08 428/220 |
| 2014/0291651 | A1* | 10/2014 | Humphries | C09K 11/06 257/40 |
| 2015/0137080 | A1* | 5/2015 | Tsai | H01L 51/0085 257/40 |
| 2017/0309826 | A1* | 10/2017 | Wang | H01L 51/0039 |
| 2018/0037812 | A1* | 2/2018 | Pegington | C09K 11/06 |

FOREIGN PATENT DOCUMENTS

| | | |
|---|---|---|
| CN | 101463253 A | 6/2009 |
| CN | 101679468 A | 3/2010 |
| CN | 102264864 A | 11/2011 |
| CN | 102627776 A | 8/2012 |
| CN | 104151534 A | 11/2014 |
| CN | 104177603 A | 12/2014 |

OTHER PUBLICATIONS

Li et al. (Chem. Mater., 2004, 16, 2165-2173) (Year: 2004).*
Guo et al. (Macromol. Chem. Phys. 2012, 213, 820-828) (Year: 2012).*
International Search Report dated Oct. 27, 2015 for corresponding foreign Application No. PCT/CN2015/071416, 2 pp.
Office Action issue for corresponding Chinese Application No. 201580000117.2 dated Jun. 29, 2016, 5 pp.

* cited by examiner

WHITE-LIGHT HYPERBRANCHED CONJUGATED POLYMER, METHOD FOR PREPARING THE SAME AND IT'S USE

CROSS-REFERENCE TO RELATED APPLICATIONS

This application is the U.S. National Phase of PCT International Application No. PCT/CN2015/071416, filed on Jan. 23, 2015. The contents of this application is herein incorporated by reference in its entirety.

BACKGROUND

Field of the Application

The present application belongs to the technical field of the application of the photoelectronic materials, and relates to a conjugated polymer with hyperbranched structure and specifically to a white-light hyperbranched conjugated polymer based on a red phosphorescent iridium(III) (Ir(III)) complex as a core and its use. The polymer is consisted of red and blue light emitting units connected through conjugated chemical bonds, and can have high-quality white light electroluminescent spectra.

Background of the Application

Electroluminescent devices made of white light polymers have gained wide focus because of its characteristics, such as energy saving, fast response, stable light color, strong environment adaptability, light weight, thin thickness, simple fabrication process and so on, by which they show great potential in lighting and displaying as next lead force of lighting source.

The white light organic electroluminescent materials as a single light-emitting layer can realize white-light emission, the white light organic electroluminescent devices are obtained mainly by introducing different light-emitting groups and utilizing the incomplete energy transfer between the different groups. Poly(9,9-dioctylfluorene) has the advantages of easy modification, wide band gap and high luminous efficiency and so on, and is important in the blue light-emitting materials, which is the first selected material for causing polymers to emit white light. And the organic electroluminescent materials with phosphorescent Ir(III) complexes can simultaneously capture singlet and triplet excitons owing to the introduction of the heavy metal element Ir, by which the material can theoretically achieve 100% internal quantum efficiency. On this basis, the efficiency of white light polymers will be improved extremely because of introducing phosphorescent chromophores to the polymer materials. Good achievements have been gained in this research field of embedding different phosphorescent groups into the main chain of the polymer in the connection manner of side chain or linear chain. However, the synthetic process using the connection manner of side chain is complicated, and the linear chain structure brings about concentration clustering and severe triplet-triplet (T-T) annihilation, thereby resulting in significant roll-off of the current efficiency in the electroluminescent devices, which is not good for the application of the devices.

SUMMARY

Application Object

First object of the present application is to provide a white-light hyperbranched conjugated polymer, in which the hyperbranched structure is adopted and a red phosphorescent group is connected to the main chain of blue fluorescent materials in the manner of conjugated chemical bonds to achieve double emission of the singlet and triplet.

Second object of the application is to provide a method for preparing the above-mentioned white-light hyperbranched conjugated polymer.

Third object of the application is to provide use of the above-mentioned white-light hyperbranched conjugated polymer.

Technical Solution

In order to achieve the above-mentioned objects, the present application adopts the following technical solutions:

The white-light hyperbranched conjugated polymer of the present application uses a red phosphorescent Ir(III) complex as a core and blue fluorescent materials as a framework/skeleton, and has a structure formula represented by the following formula (I):

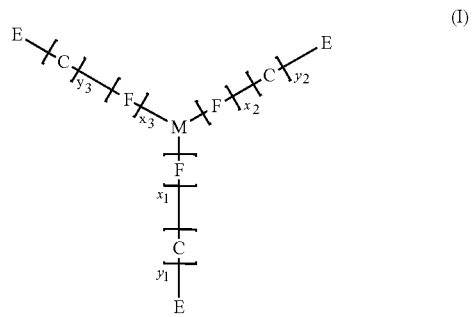

wherein: M represents the red phosphorescent Ir(III) complex, F and C respectively represent the different blue fluorescent materials, E represents an end-capping group, x and y respectively represent the monomer number of the different blue fluorescent materials, x equaling $x_1+x_2+x_3$ is a positive integer; and y equaling $y_1+y_2+y_3$ is a natural number. The content of the red phosphorescent Ir(III) complex M in the hyperbranched polymer is in the range of 0.05 to 0.5 mol % (such as 0.07 mol %, 0.08 mol %, 0.10 mol %, 0.12 mol %, 0.15 mol %, 0.20 mol %, 0.25 mol %, 0.28 mol %, 0.30 mol %, 0.35 mol %, 0.40 mol %, 0.45 mol %, or 0.48 mol %). The weight-average molecular weight of the white light hyperbranched polymer is in the range of 10K to 150K; the number-average molecular weight of the white light hyperbranched polymer is in the range of 7K to 30K; the molecular weight distribution index of the white light hyperbranched polymer is more than 0 and no more than 6. The hyperbranched polymer has three branched chains; the glass transition temperature of the hyperbranched polymer is in the range of 120° C. to 200° C.

With the aforementioned white-light hyperbranched conjugated polymer, the content of the red phosphorescent Ir(III) complex M in the hyperbranched polymer preferably ranges from 0.05 to 0.2 mol %.

With the aforementioned white-light hyperbranched conjugated polymer, the content of the blue fluorescent material C in the hyperbranched polymer preferably is less than 50 mol %. The blue fluorescent material C is a derivative based on carbazole group having good blue light emitting property and high triplet energy level, which is generally capable to be used as host material to prepare the organic electroluminescent devices with high performance. The carbazole derivative is introduced not only to be used as a blue fluorescence unit, but also to break the long-range conjugation of the polymer, thereby improving the triplet energy level of the polymer, so as to remarkably improve energy transfer efficiency. Meanwhile, the glass transition temperature of the hyperbranched polymer can be improved by introducing the carbazole derivatives, which lays a good foundation for preparing organic electroluminescent devices with high performance.

Specifically, the blue fluorescent material F is a fluorene derivative monomer with the following structure general formula (II):

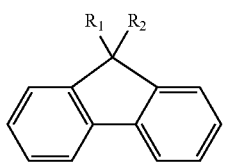

(II)

wherein: $R_1$ and $R_2$ independently are an alkyl group with the number of carbon atom selected in the range of 1 to 16 (namely a $C_{1\sim16}$ alkyl group);

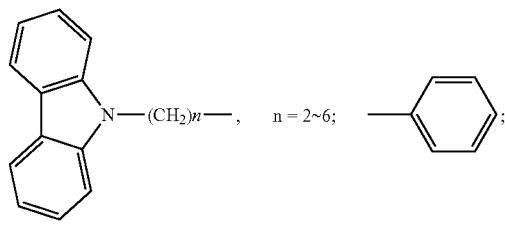

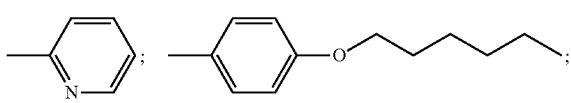

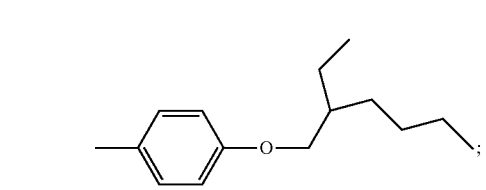

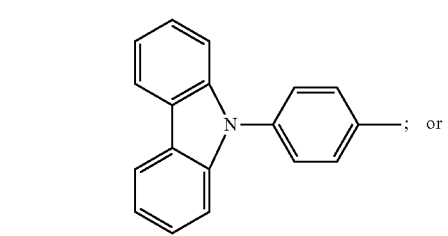

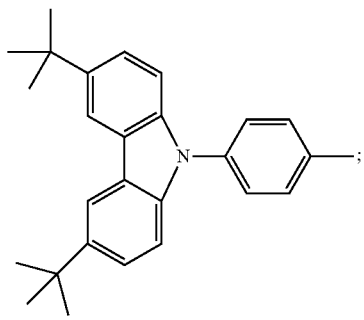

and $R_1$ and $R_2$ are same or different.

The blue fluorescent material C is a carbazole derivative with the following structure general formula (III):

(III)

wherein: $R_3$ is an alkyl group with the number of carbon atom selected in the range of 2 to 16 (namely a $C_{2\sim16}$ alkyl group);

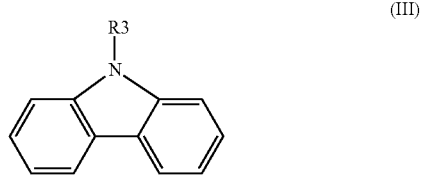

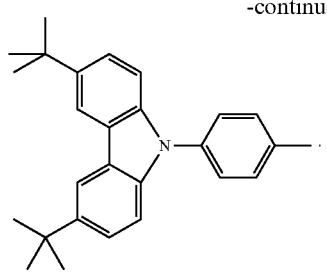

With the aforementioned white-light hyperbranched conjugated polymer of the present application, the red phosphorescent Ir(III) complex M can be any one of the following complexes:

Ir(piq)$_3$ with the structure formula

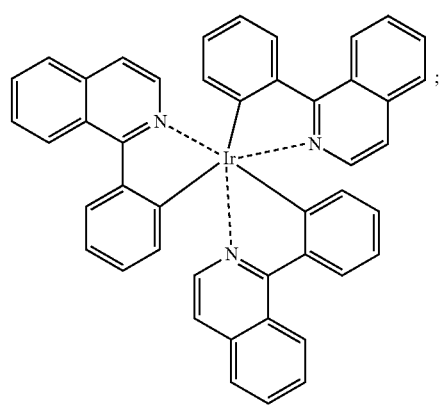

Ir(piq)$_2$(pytzph) with the structure formula

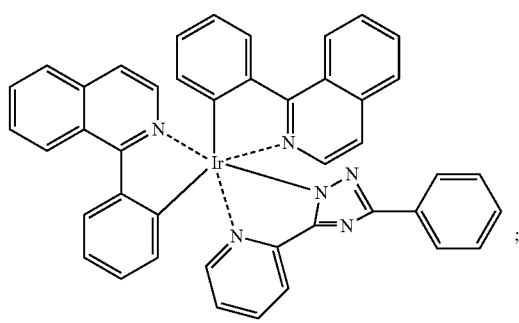

Ir(piq)$_2$(pytz) with the structure formula

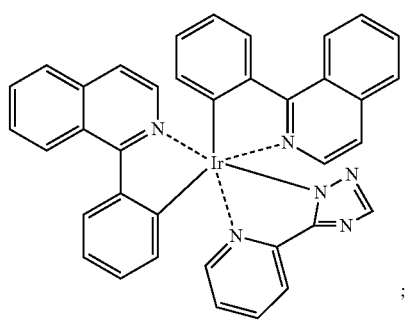

Ir(napy)$_2$(acac) with the structure formula

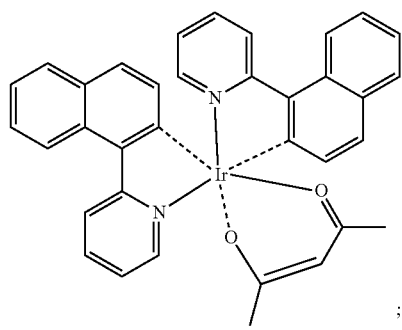

Ir(piq)$_2$(acac) with the structure formula

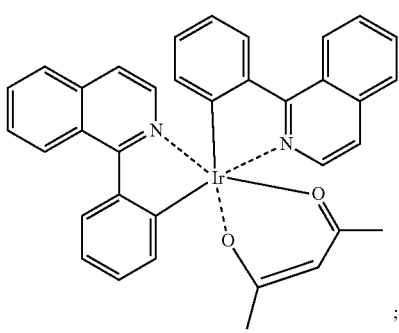

Ir(napy)$_2$(pytz) with the structure formula

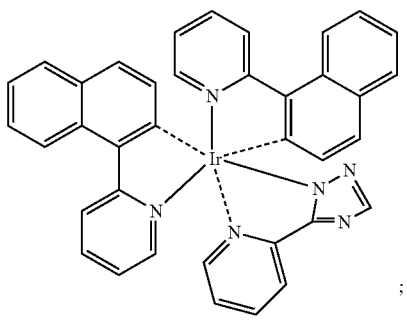

Ir(ppy)$_2$(piq) with the structure formula

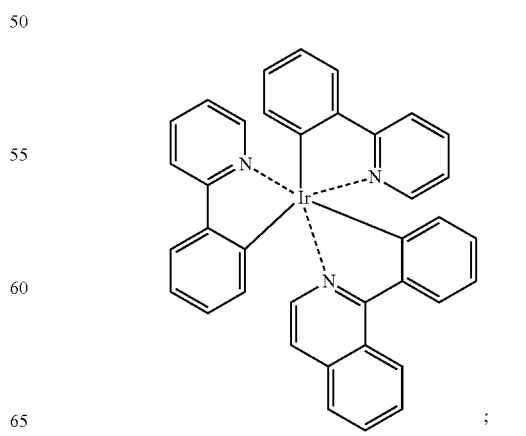

Ir(4mapq)$_2$(acac) with the structure formula

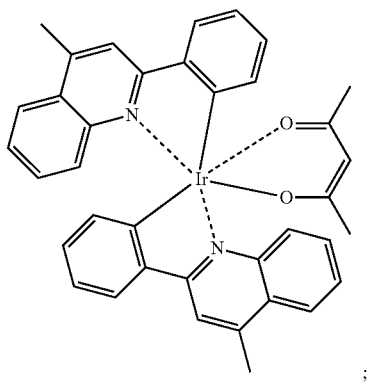
;

Ir(4m2thq)$_2$(acac) with the structure formula

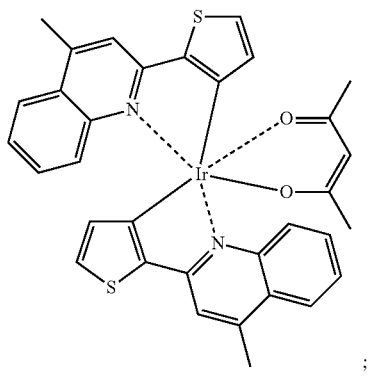
;

Ir(ppz)$_2$(piq) with the structure formula

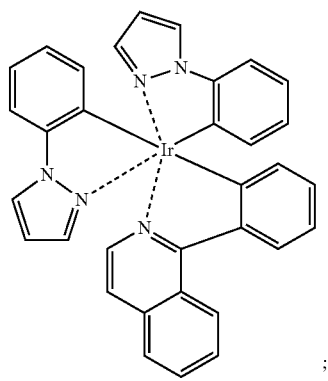
;

Preferably, the red phosphorescent Ir(III) complex of the present application is Ir(piq)$_3$.

With the white-light hyperbranched conjugated polymer of the present application, the blue fluorescent material F further preferably is 9,9-dioctylfluorene; the blue fluorescent material C further preferably is 9-(2-ethylhexyl)carbazole.

With the white-light hyperbranched conjugated polymer of the present application, the end-capping group E of the polymer is any one of phenyl, α-naphthyl and β-naphthyl.

A method for preparing the aforementioned white-light hyperbranched conjugated polymer is as follows: Suzuki reaction is conducted using raw materials represented by structure general formulas 1)-3), thereby obtaining the white-light hyperbranched conjugated polymer; wherein: the raw material represented by structure general formula 1) is the bromide of the red phosphorescent Ir(III) complex M represented by MBr$_3$; the raw materials represented by the structure general formula 2) are the derivatives of fluorene reaction monomer represented by formulas (IV) and (V):

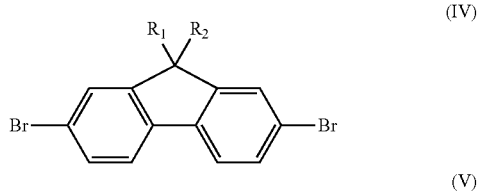
(IV)

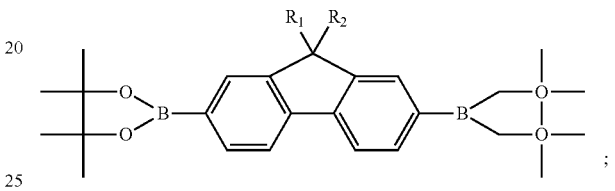
(V)

the raw material represented by the structure general formula 3) is the derivative of carbazole reaction monomer represented by formula (VI):

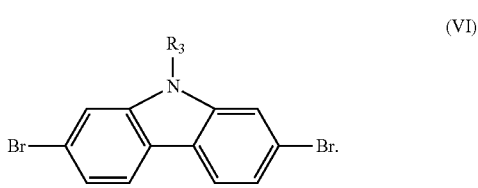
(VI)

As a preferred embodiment according to the abovementioned preparing method, the SUZUKI reaction is conducted under the protection of inert gas by the following steps of: firstly adding four raw materials of the derivatives of fluorene reaction monomer represented by formulas (IV) and (V), the derivative of carbazole reaction monomer represented by formula (VI) and the bromide of the red phosphorescent Ir(III) complex M represented by MBr$_3$ with different mole ratios into toluene solvent, and stirring to uniformly mix; afterwards, adding tetrakis(triphenylphosphine)palladium catalyst (Pd(PPh$_3$)$_4$), the trimethyl trioctyl ammonium chloride (Aliquat 336) as a phase transfer catalyst and K$_2$CO$_3$ aqueous solution, stirring, being heated to the refluxing temperature, and reacting for 48~60 h; and finally, adding end-capping materials with the end-capping group E, and reacting, thereby obtaining a reacting solution including the target product; wherein: with the four raw materials, the mole ratio of the bromide of the red phosphorescent Ir(III) complex M represented by MBr$_3$ to the other three blue light emitting raw materials is 1:200~2000, and preferably the mole ratio of the bromide of the red phosphorescent Ir(III) complex M represented by MBr$_3$ to the other three blue light emitting raw materials is 1:600~2000; and with the four raw materials, the mole ratio of the bromide of the red phosphorescent Ir(III) complex M represented by MBr$_3$, the derivative of fluorene reaction monomer represented by formula (IV), the derivative of fluorene reaction monomer represented by formula (V), and the derivative of carbazole reaction monomer represented by formula (VI) is 1:0~998.5:300~1000:0~998.5, and the mole sum of the derivative of fluorene reaction monomer represented by formula (IV) and the derivative of carbazole reaction monomer represented by formula (VI) is less than the mole number of the derivative of fluorene reaction monomer represented by formula (V).

As a preferred embodiment according to the aforementioned preparing method, the mole percentage of tetrakis(triphenylphosphine)palladium (Pd(PPh$_3$)$_4$) to the functional groups participating in SUZUKI reaction (for example, calculated as boron reaction functional group) is in the range of 1 mol % to 3 mol %.

As a preferred embodiment according to the aforementioned preparing method, the bromide of the red phosphorescent Ir(III) complex M represented by MBr$_3$ is synthesized by the following method of: firstly placing 1-(4-bromophenyl)-isoquinoline as the main ligand monomer and Iridium(III) trichloride trihydrate (IrCl$_3$.3H$_2$O) with the molar ratio of 2~2.5:1 into solvent system, performing reflux and reacting at 100~140° C. under the protection of inert gas, thereby obtaining the cyclometalated iridium(III) μ-chlorobridged dimer (namely Ir(III) chloride bridge dimer) of 1-(4-bromophenyl)-isoquinoline; and afterwards reacting the cyclometalated iridium(III) μ-chlorobridged dimer of the ligand, 1-(4-bromophenyl)-isoquinoline as a corresponding auxiliary ligand monomer and 3-(4-bromophenyl)-5-(2-pyridyl)-1,2,4-triazole according to the mole ratio of 1:2~2.5 at 100~200° C. in a solvent system under the protection of inert gas in the presence of an anhydrous alkali metal carbonate or silver trifluoroacetate as a catalyst, thereby obtaining the bromide of red phosphorescent Ir(III) complex M; wherein: the solvent system preferably is ethoxyl ethanol or degassing glycerin.

As a preferred embodiment according to the aforementioned preparing method, the reaction of adding the end-capping materials with the end-capping group E is conducted by the following steps of: firstly adding the boride of the end-capping group E and reacting for 12 h, and afterwards adding the bromide of the end-capping group E and reacting for another 12 h; wherein: the boride of the end-capping group E more preferably is phenylboronic acid, α-naphthylboronic acid or β-naphthylboronic acid; the bromide of end capping group E more preferably is bromobenzene, α-bromonaphthalene or β-bromonaphthalene; the percentage of the boride of the end-capping group E to the four raw materials is in the range of 1 to 3 wt %; and the percentage of the bromide of the end-capping group E to the four raw materials is in the range of 10 wt % to 35 wt %.

As a preferred embodiment according to the aforementioned preparing method, the method further comprises the following post-processing step of: slowly pouring the reaction solution containing the target product cooled to room temperature into methanol solution being rapidly stirred to separate out a solid; filtering and drying the solid; treating the resulting solid with acetone by Soxhlet extraction for 48~72h, thereby obtaining a crude product; and treating the crude product by column chromatography with chloroform or tetrahydrofuran as an eluent, thereby obtaining the white-light hyperbranched conjugated polymer being solid powders with different colors according to the content of the red phosphorescent Ir(III) complex M; for the reaction solution containing the target product.

As a preferred embodiment, the white-light hyperbranched conjugated polymer of the present application can be a hyperbranched conjugated polymer using the red phosphorescent Ir(piq)$_3$ complex (M) as a core and blue fluorescent material (F) poly(9,9-dioctylfluorene) as the framework, abbreviated as PF-Ir(piq)$_3$, and having a structure formula represented by the following formula (VII):

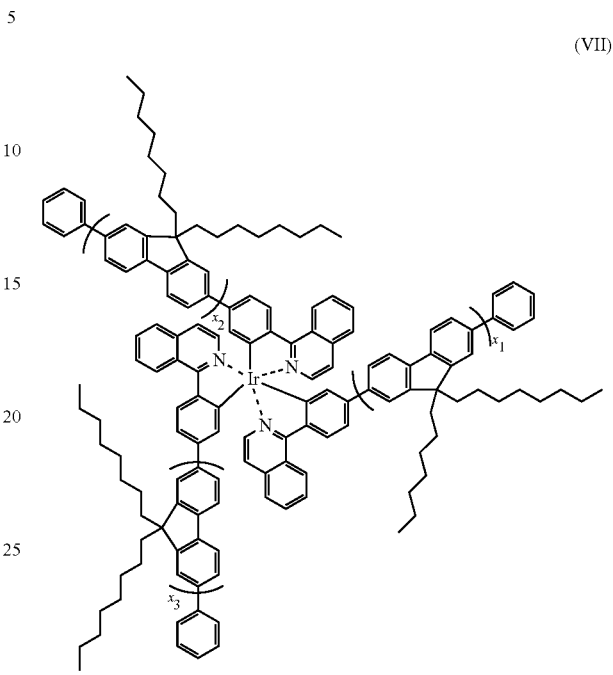

(VII)

wherein: x equaling $x_1+x_2+x_3$ represents the number of 9,9-dioctylfluorene, and x is a positive integer. The molar percentage of the red phosphorescent complex Ir(piq)$_3$ in the conjugated polymer ranges from 0.05 to 0.5 mol %. The number-average molecular weight of the polymer ranges from 9K to 20K, the weight-average molecular weight thereof ranges from 20K to 50K; and the molecular weight distribution index thereof is in the range of 1.5 to 5. The glass transition temperature of the polymer is from 130° C. to 160° C. The polymer has three branched chains.

The method for preparing the white-light hyperbranched conjugated polymer PF-Ir(piq)$_3$ represented by the aforementioned formula (VII) of the present application has the following steps of:

1) synthesizing the main ligand 1-(4-bromophenyl)-isoquinoline (piqBr) by 1-chloroisoquinoline and 4-bromophenylboronic acid as the raw materials;
2) synthesizing cyclometalated iridium(III) μ-chlorobridged dimer (Ir(III) chloride bridge dimer) by the main ligand 1-(4-bromophenyl)-isoquinoline and iridium(III) trichloride in the mixture solution of 2-ethoxy ethanol and water;
3) obtaining tri(2-(4-bromophenyl)-isoquinoline) iridium (III) (Ir(piqBr)$_3$) complex by sequentially reacting the cyclometalated iridium(III) μ-chlorobridged dimer (Ir(III) chloride bridge dimer) with 1-(4-bromophenyl)-isoquinoline;
4) refluxing and reacting 2,7-bis(4,4,5,5-tetramethyl-1,3-dioxo-2-boronalkyl)-9,9-dioctylfluorene (commercially available product), 2,7-dibromo-9,9-dioctylfuorene (commercially available products) and Ir(piqBr)$_3$ in the mixture solution of toluene and K$_2$CO$_3$ aqueous solution for 48~60h in the presence of tetrakis(triphenylphosphine)palladium (Pd(PPh$_3$)$_4$) catalyst and the phase transfer catalyst Aliquat 336; subsequently adding the end-capping materials with the end-capping group E and reacting, thereby obtaining the reaction solution containing the target product; and post-processing the reaction solution, thereby obtaining the white-light hyperbranched conjugated polymer PF-Ir(piq)$_3$.

The synthetic route thereof is shown below:

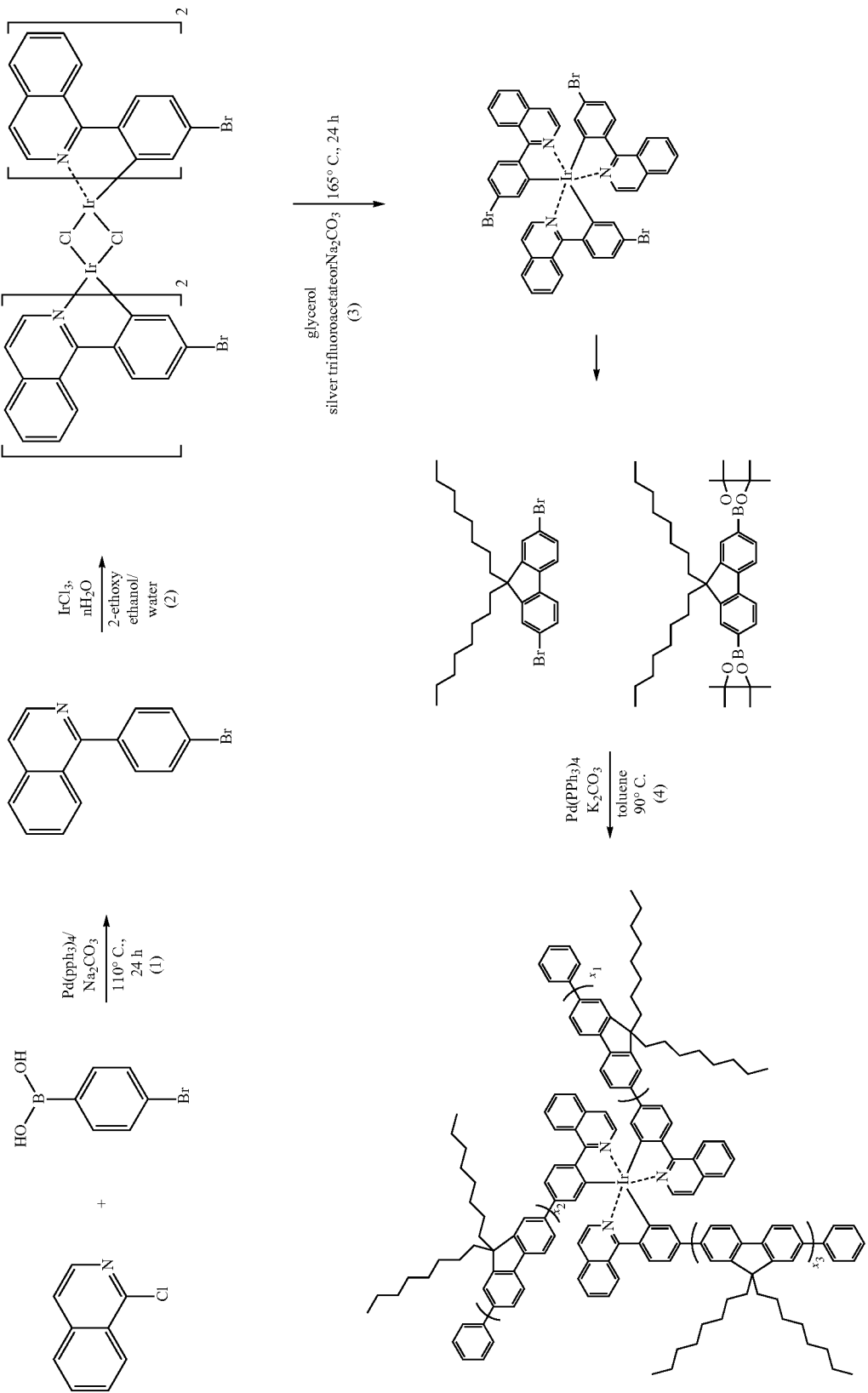

By adjusting the content of each monomer, the different white-light hyperbranched conjugated polymers can be obtained. The mole ratio of Ir(piqBr)$_3$, 2,7-bis(4,4,5,5-tetramethyl-1,3-dioxo-2-boronalkyl)-9,9-dioctylfluorene and 2,7-dibromo-9,9-dioctylfuorene preferably is 1:100~2000: 98.5~1998.5.

Tri(2-(4-bromophenyl)-isoquinoline) iridium(III) (Ir(piqBr)$_3$) complex is obtained by the following method of: refluxing and reacting the main ligand monomer 1-(4-bromophenyl)-isoquinoline and iridium(III) trichloridetrihydrate according to the molar ratio of 2~2.5:1 at 105~130° C. in the mixture solution of ethoxyl ethanol and water under the inactive gas protection, thereby obtaining corresponding the cyclometalated iridium(III) μ-chlorobridged dimer (Ir(III) chloride bridge dimer); and then reacting the corresponding cyclometalated iridium(III) μ-chlorobridged dimer (Ir(III) chloride bridge dimer) with 1-(4-bromophenyl)-isoquinoline according to the molar ratio of 1:2~2.5 at 110~190° C. in the presence of the anhydrous alkali carbonate catalyst or silver trifluoroacetate in ethoxyl ethanol solution system under the inert gas protection.

As another preferred embodiment, the white-light hyperbranched conjugated polymer of the present application can be a hyperbranched conjugated polymer using the red phosphorescent complex Ir(piq)$_3$ as a core and the blue fluorescent material poly(9,9-dioctylfluorene) containing 9-(2-ethylhexyl)carbazole as a framework, abbreviated as PFCz-Ir(piq)$_3$, and having a structure formula (VIII) represented by the following formula:

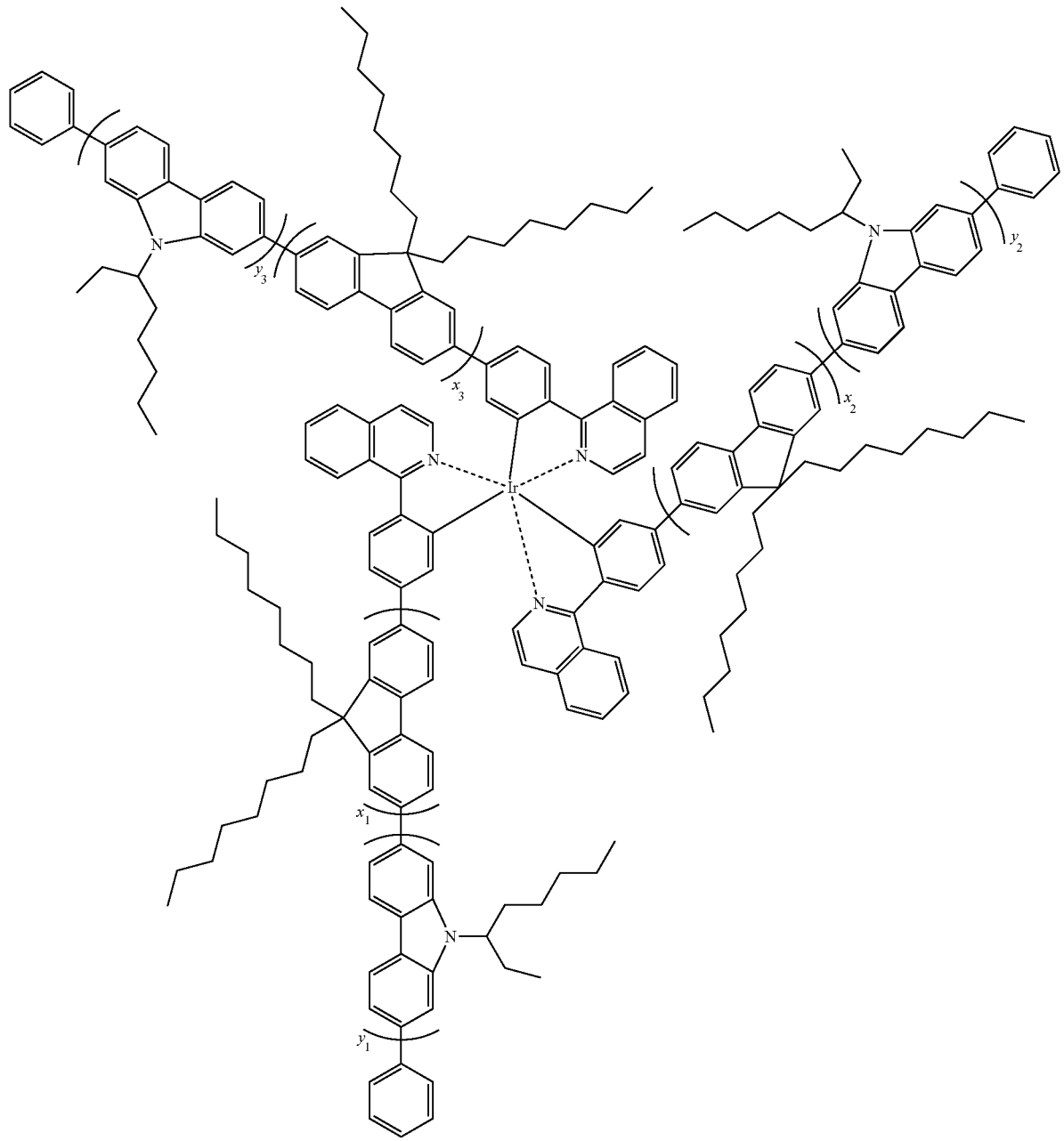

(VII)

wherein, x which equals $x_1+x_2+x_3$ represents the number of 9,9-dioctylfluorene, y which equals $y_1+y_2+y_3$ represents the number of 9-(2-ethylhexyl)carbazole, and x and y are positive integer. The mole percentage of the red phosphorescent complex Ir(piq)$_3$ in the conjugated polymer ranges from 0.05 to 0.5 mol %. The molar percentage of 9-(2-ethylhexyl)carbazole in the conjugated polymer is more than 0 mol % and less than 50 mol %. The number-average molecular weight of the polymer ranges from 7K to 30K and the weight-average molecular weight ranges from 10K to 100K, the molecular weight distribution index is more than 0 and less than 6. The glass transition temperature thereof is in the range of 130° C. to 200° C., the polymer has three branched chains.

The white-light hyperbranched conjugated polymers synthesized in this application are mainly used as organic electroluminescent materials, particularly as organic electroluminescent phosphorescent materials.

The white-light hyperbranched conjugated polymer prepared in this application contains two light-emitting units of red light and blue light, the hyperbranched structure is adopted in the conjugated polymer, and the red phosphorescent Ir(III) complex is incorporated into the main chain formed from the blue fluorescent materials by conjugated bond, thereby realizing double emission of the singlet and triplet. The balanced emission of blue and red lights during the electroluminescent process can be realized by incorporating two luminescent units into the main chain of the polymer in the connection manner of covalent bond and controlling the content of the red light unit, thereby achieving white-light electroluminescent spectra with high-quality.

As is well known, the red phosphorescent Ir(III) complex materials have very good electroluminescent performance, so as to be widely used as the electroluminescent materials. In this application, the red phosphorescent Ir(III) complex materials being red light-emitting unit as branched nodes are introduced to the polymers and act as the core of the hyperbranched structure, and effective white light emission is achieved through the spin-orbit coupling of Ir and cross-linking effect in the system. The hyperbranched structure thereof not only increases the steric hindrance of the phosphorescence core, but also effectively reduces the concentration gathering of the phosphorescent materials and annihilation caused by the gathering of triplet-triplet, by which the efficiency roll-off in the electroluminescent devices can effectively be restrained and the white-light emission with high efficiency is realized, thus, the performance of the organic electroluminescent material is improved.

In this application, the red phosphorescent Ir(III) complex is incorporated into blue fluorescent materials based on polyfluorene in the connection manner of conjugated chemical bonds so as to realize incomplete energy transfer from polyfluorene to the red phosphorescent Ir(III) complex and achieve complementary white light emitting, thereby effectively improving the luminescent efficiency of the white polymers.

With the white-light hyperbranched conjugated polymers of the present application, effective white electroluminescent materials are obtained by controlling the proportion of red light emitting unit material and blue light emitting unit materials to realize red and blue double-colors emission. The electronic energy level of main chain can be changed to realize the above mentioned controlling by introducing modifying groups into polyfluorene side chain and introducing the carbazole modifying groups into the polyfluorene chain. The polymer uses a red phosphorescent Ir(III) complex as a core and polyfluorene derivative blue fluorescent materials as a framework which either contains or does not contain carbazole derivatives, and the white hyperbranched polymers realize white-light emission by adjusting the content of the red phosphorescent Ir(III) complex added using the complementation of blue and red color. The electroluminescent spectrum of the conjugated polymer in the present application covers the whole visible light emission region and is close to the pure white light emission, by which the conjugated polymer could be used as a material used in light-emitting layer to prepare the organic electroluminescent devices.

In the present application, the white-light hyperbranched conjugated polymers are synthesized using classic SUZUKI reaction which reduces the difficulty in the preparation and is suitable for industrial production.

Thus, an organic electroluminescent device is also provided in the present application which contains the white-light hyperbranched conjugated polymer materials. The white-light hyperbranched conjugated polymer materials contain the emitting groups with the above-mentioned different ratio and different modifying groups.

Furthermore, the white-light hyperbranched conjugated polymers are used as the light emitting layer material in the organic light-emitting devices, which has the hole and electron transporting ability, thus, the preparation process can be simplified.

In this application, the white-light hyperbranched conjugated polymers are prepared as a solution, then an electroluminescent device is obtained by spin-coating process. Owing to completing controlling of the content of the Ir(III) complex during synthesis of the conjugated polymers, the process for preparing the devices is simplified largely. It is easy for the white-light hyperbranched conjugated polymers of the present application to dissolve in many organic solvents, that is, they have good solubility. The white-light hyperbranched conjugated polymers as light emitting layer can be used to prepare light-emitting devices with simple structure, thereby being capable to realize the large-area flexible display. And meanwhile these polymers also can be used in the wet preparation, ink-jet printing process and so on. Thus, the conjugated polymers can be greatly improved in availability.

The white-light hyperbranched conjugated polymers in the present application as a single light-emitting layer can be used to prepare POLED, thereby reducing the layer number of the white OLED, improving the luminous efficiency, stabilizing luminescent color, reducing the turn-on voltage and simplifying the production process.

DETAILED DESCRIPTION OF THE EMBODIMENTS

Hereafter, the present application will be further described in combination with embodiments. The embodiments are only a review for concept mentioned by the present application, but should not be interpreted as limitation for the present application.

Embodiment 1

(1) Preparation of 1-(4-bromophenyl)-isoquinoline (piqBr) is as follows: 1.63 g (10 mmol) of 1-chloroisoquinoline and 2.00 g (10 mmol) of 4-bromophenylboronic acid are added into a 100 mL two-neck flask with 20 mL of toluene, and followed by being evacuated, being introduced nitrogen and being stirred to become homogenous. After this, 34.68 mg (0.03 mmol) of tetrakis(triphenylphosphine) palladium (Pd(PPh$_3$)$_4$) as a catalyst and 5 mL of ethanol as a phase transfer agent are added, and followed by continuing to be evacuated, being introduced nitrogen and being stirred to become homogenous. And then 5 mL of 2 mol/L Na$_2$CO$_3$ solution is added and reaction is conducted at 94° C. for 8h. The resulting reaction solution is cooled to room temperature, washed with water and dried with anhydrous MgSO$_4$, and then toluene as an organic solvent is removed by rotary evaporation. The resulting crude product was purified by silica gel column chromatography (with an eluent, dichloromethane/n-hexane (1:4)). 2.21 g of 1-(4-bromophenyl)-isoquinoline (piqBr) which is white needle-like crystals and of which yield is 78% is obtained.

Figure 1:
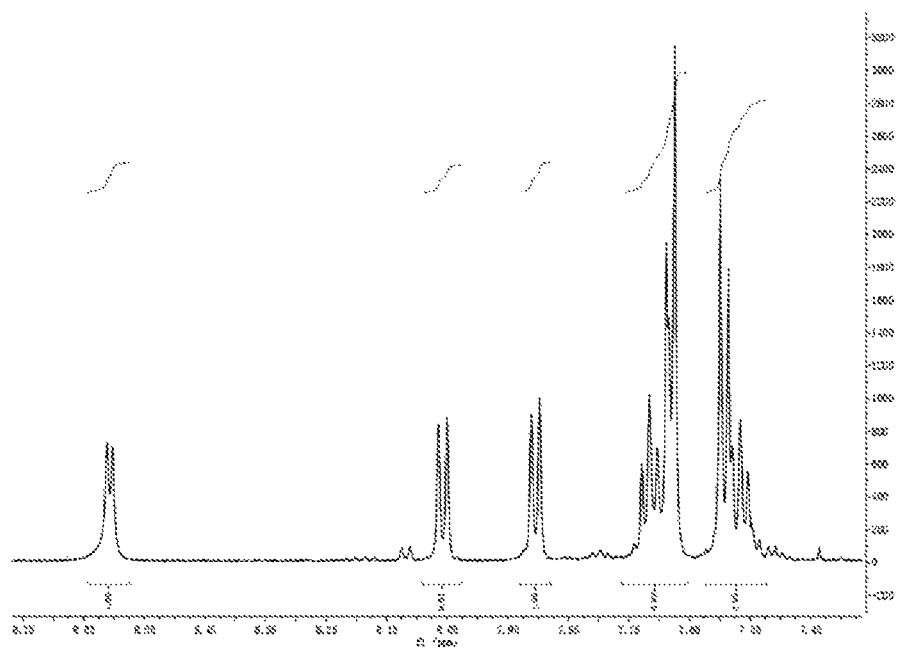
FIG. 1 shows the $^1$H NMR spectrum of 1-(4-bromophenyl)isoquinoline in embodiment 1.

$^1$HNMR spectrum of the product is shown in FIG. 1. $^1$HNMR (600 MHz, CDCl$_3$): δ(ppm)=8.61 (d, J=5.4 Hz, 1H), 7.98 (d, J=3 Hz, 2H), 7.74-7.53 (m, 7H). Characteristic peaks are located between 7 and 9, indicating that all of the hydrogen atoms (H) on piqBr are located on the benzene ring, and the total number of the hydrogen atoms (H) in the spectrum equals the total number of the hydrogen atoms (H) actually existing on piqBr.

(2) Preparation of tris(2-(4-bromophenyl)-isoquinoline) iridium (Ir(piqBr)$_3$) is as follows:

(a) Under nitrogen atmosphere, 317 mg (1 mmol) of iridium trichloride and 622 mg (2.2 mmol) of piqBr are dissolved into a mixture of 21 mL of 2-ethoxyethanol and 7 mL of water, and followed by being stirred and meanwhile being slowly heated to 120° C., and the reaction is conducted at 120° C. for 24 h. After cooling to room temperature, the reaction product is washed with water and is filtered, thereby getting a red precipitate being a crude product. And then the crude product is washed with ethanol, and is dried, thereby achieving cyclometalated iridium(III) μ-chlorobridged dimer (Ir(III) chloride bridge dimer) being reddish-brown solid powers.

(b) Under nitrogen atmosphere, 316 mg (0.2 mmol) of the cyclometalated iridium(III) μ-chlorobridged dimer (Ir(III) chloride bridge dimer), 125 mg (0.44 mmol) of piqBr and 44 mg (0.2 mmol) of silver trifluoroacetate are dissolved in 16 mL of degassed glycerol, and then are stirred and meanwhile slowly heated to 165° C., and the reaction is conducted at 165° C. for 24 h. A large amount of water is added to the solution after reaction to separate out red precipitate after cooling to room temperature, and then the red precipitate is filtered and dried. The resulting crude solid product is purified by silica gel column chromatography (with an eluent, dichloromethane/petroleum ether (1:8)), thereby obtaining 83.3 mg of tris(2-(4-bromophenyl)-isoquinoline) iridium complex (Ir(piqBr)$_3$) which is dark red solid powder and of which yield is 20%.

Figure 2:
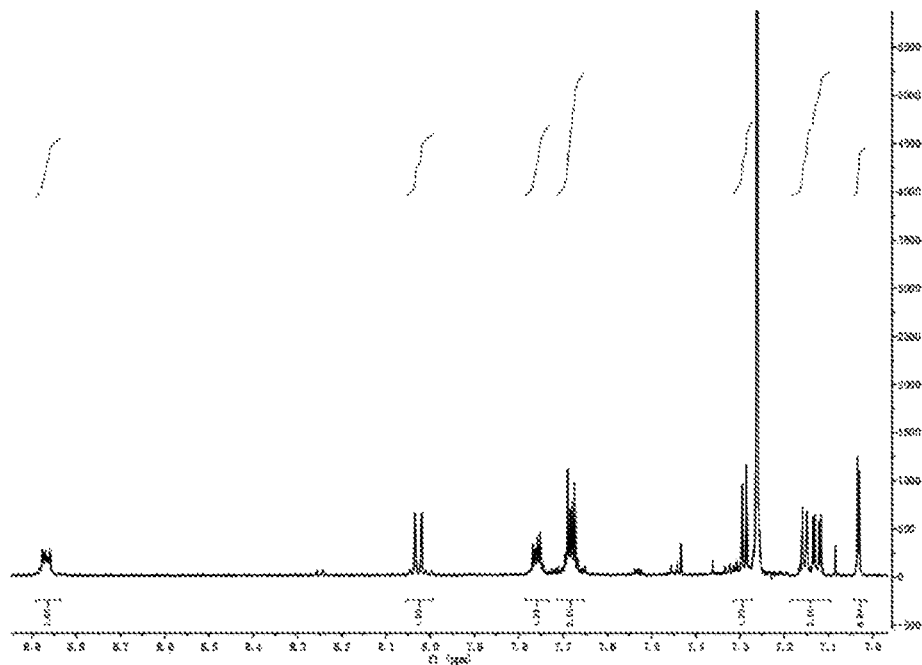
FIG. 2 shows the $^1$H NMR spectrum of Ir(piqBr)$_3$ complex in embodiment 1.

$^1$H NMR spectrum of Ir(piqBr)$_3$ is shown in FIG. 2. $^1$HNMR (600 MHz, CDCl$_3$): δ(ppm)=8.87 (dd, J$_1$=7.2 Hz, J$_2$=3 Hz, 3H), 8.03 (d, J=8.4 Hz, 3H), 7.76 (dd, J$_1$=5.4 Hz, J$_2$=3 Hz, 3H), 7.70-7.67 (m, 6H), 7.29 (d, J=6.6 Hz, 2H), 7.15 (d, J=6.6 Hz, 3H), 7.13 (dd, J$_1$=8.4 Hz, J$_2$=2.4 Hz, 3H), 7.03 (d, J=1.8 Hz, 3H). It can be seen that the total number of the hydrogen atoms (H) in the spectrum equals the total number of the hydrogen atoms (H) in real molecule, and the coupling of characteristic peaks matches with the coupling splitting of the hydrogen atoms (H) on Ir(piqBr)$_3$.

For elemental analysis of Ir(piqBr)$_3$, the result in theory is as follows: by percent (%), C, 51.89; H, 2.61; N, 4.03; the detecting result is as follows: by percent (%) C, 53.40; H, 2.95; N, 3.36. TOF-MS testing value is 1039.07, and calculated value is 1041.64.

(3) Preparation of PF-Ir(piq)$_3$500 (wherein, 500 represents that the molar percentage of the red phosphorescent complex Ir(piqBr)$_3$ in the whole polymer is 0.5 mol %) is as follows: Under nitrogen atmosphere, 642.6 mg (1 mmol) of 2,7-bis(4,4,5,5-tetramethyl-1,3-dioxo-2-boronalkyl)-9,9-dioctylfluorene (commercially available) as the reaction monomer, 540.2 mg (0.985 mmol) of 2,7-dibromo-9,9-dioctylfluorene (commercially available) and 10.4164 mg (0.01 mmol) of Ir(piqBr)$_3$ are added into toluene (13.6 mL) and stirred for 30 min to fully mix and become homogenous. After mixing, 46.4 mg (0.04 mmol) of Pd(PPh$_3$)$_4$, 2 drops of trimethyl trioctyl ammonium chloride (Aliquat 336) as a phase transfer catalyst, 6 mL of 2 mol/L K$_2$CO$_3$ solution are added into the mixed solution in turn, and followed by being stirred and slowly heated to refluxing temperature 94° C., and the reaction is conducted at 94° C. for 48h. Subsequently, 20 mg of phenylboronic acid as an end-capping material is added, and the reaction is conducted for 12h, after this, 0.2 mL of bromobenzene as an end-capping material is added and the reaction is conducted for another 12h. The solution after reaction is slowly poured into methanol being rapidly stirred to separate out a pink solid after cooling to room temperature, and then filtration and dry are conducted. The resulting solid was treated by Soxhlet extraction with acetone for 48h, thereby obtaining the crude product. The crude product is purified by silica gel column chromatography (with an eluent, chloroform), thereby getting 414 mg of PF-Ir(piq)$_3$500 which is pink solid powders and of which yield is 53%.

$^1$HNMR spectral data of PF-Ir(piq)$_3$500 of the embodiment is as follows: $^1$HNMR (600 MHz, CDCl$_3$): δ(ppm)=7.88 (1H, Ar—H), 7.67-7.66 (2H, Ar—H), 2.15 (2H, CH$_2$), 1.28-1.02 (10H, 5CH$_2$), 0.89-0.81 (5H, CH$_2$, CH$_3$). As can be seen from the spectrum the hydrogen atoms (H) on benzene ring of fluorene mainly range from 8 to 7 and mainly have two different positions, the hydrogen atoms (H) on alkyl chain range from 3 to 0.5, and the hydrogen atoms (H) on the red phosphorescent Ir(piq)$_3$ are not included in integral due to the low content.

The average molecular weight of PF-Ir(piq)$_3$500 is measured by gel permeation chromatography, the weight-average molecular weight thereof is 50.0K, the number-average molecular weight thereof is 18.9K, and the molecular weight distribution index thereof is 2.65. The glass transition temperature of the polymer is 139° C. and the polymer has three branches.

Embodiment 2

(1) The synthetic method of Ir(piqBr)$_3$ is the same as that of embodiment 1.

(2) Preparation of PF-Ir(piq)$_3$500 is as follows: Under nitrogen atmosphere, 642.6 mg (1 mmol) of 2,7-bis(4,4,5,5-tetramethyl-1,3-dioxo-2-boronalkyl)-9,9-dioctylfluorene as a reaction monomer, 540.2 mg (0.985 mmol) of 2,7-dibromo-9,9-dioctylfluorene and 10.4164 mg (0.01 mmol) of Ir(piqBr)$_3$ are added into 20.4 mL of toluene and stirred for 30 min to fully mix and become homogenous. After mixing, 23.2 mg (0.02 mmol) of Pd(PPh$_3$)$_4$, 2 drops of Aliquat 336, and 6 mL of 2 mol/L K$_2$CO$_3$ solution are added into the mixed solution in turn and heated to the refluxing temperature, and then the reaction is conducted for 48h. After this, 20 mg of phenylboronic acid as an end-capping material is added and reacts for 12h, and then 0.2 mL of bromobenzene as an end-capping material is added and reacts for another 12h. The solution after reaction is slowly poured into methanol being rapidly stirred to separate out a pinkish white solid after cooling to room temperature, and then the pinkish white solid is filtered and dried. The resulting solid is treated by Soxhlet extraction with acetone for 48h, thereby obtaining the crude product, and then the crude product is purified by silica gel column chromatography (with an eluent, chloroform), thereby obtaining 320.3 mg of PF-Ir(piq)$_3$500 which is pink solid powders and of which yield is 41%.

Embodiment 3

(1) Preparation of tris(2-(4-bromophenyl)-isoquinoline) iridium (Ir(piqBr)$_3$) is as follows:

(a) Synthetic method of the cyclometalated iridium(III) μ-chlorobridged dimer (Ir(III) chloride bridge dimer) is the same as that of embodiment 1.

(b) Preparation of tris(2-(4-bromophenyl)-isoquinoline) iridium Ir(piqBr)$_3$ is as follows: under nitrogen atmosphere, 316 mg (0.2 mmol) of the cyclometalated iridium(III) μ-chlorobridged dimer (Ir(III) chloride bridge dimer), 125 mg (0.44 mmol) of piqBr and 22 mg (0.1 mmol) of silver trifluoroacetate are dissolved in 16 mL of degassed glycerol. The resulting mixture is slowly heated to 130° C. and reacts for 24h. A large amount of water is added into the solution after reaction to separate out a red precipitate after cooling to room temperature, and then the red precipitate is filtered and dried. The resulting crude solid product is purified by silica gel column chromatography (with an eluent, dichloromethane/petroleum ether (1:8)), thereby getting 32.8 mg of tris(2-(4-bromophenyl)-isoquinoline)iridium (Ir(piqBr)$_3$) which is dark red solid powder and of which yield is 7.8%.

(2) The method for preparing PF-Ir(piq)$_3$500 is the same as that of embodiment 1 (3).

Embodiment 4

(1) The synthetic method of Ir(piqBr)$_3$ is the same as that of embodiment 1.

(2) The preparation of PF-Ir(piq)$_3$100 (100 represents that the molar percentage of the red phosphorescent Ir(piqBr)$_3$ in the whole polymer is 0.1 mol %) is as follows: Under nitrogen atmosphere, 642.6 mg (1 mmol) of 2,7-bis(4,4,5,5-tetramethyl-1,3-dioxo-2-boronalkyl)-9,9-dioctylfluorene as a reaction monomer, 546.8 mg (0.98597 mmol) of 2,7-dibromo-9,9-dioctylfluorene and 2.08328 mg (0.002 mmol) of Ir(piqBr)$_3$ are added into 13.6 mL of toluene and stirred for 30 min to fully mix and become homogenous. 46.4 mg (0.04 mmol) of Pd(PPh$_3$)$_4$, 2 drops of Aliquat 336, 6 mL of 2 mol/L K$_2$CO$_3$ solution are added into the mixed solution in turn, and followed by being stirred and slowly being heated to refluxing temperature 94° C., and then the reaction is conducted for 48 h. After this, 20 mg of phenylboronic acid as an end-capping material is added and the reaction is conducted for 12h, and then 0.2 mL of bromobenzene as an end-capping material is added and the reaction is conducted for another 12h. The solution after reaction is slowly poured into methanol being rapidly stirred to separate out a yellowish white solid after cooling to room temperature, and then the yellowish white solid is filtered and dried. The resulting solid is treated by Soxhlet extraction with acetone for 48h, thereby obtaining the crude product, and then the crude product is purified by silica gel column chromatography (with an eluent, chloroform), thereby getting 461 mg of PF-Ir(piq)$_3$100 which is yellowish red solid powders and of which yield is 59%.

$^1$HNMR spectral data of PF-Ir(piq)$_3$100 of the embodiment is as follows: $^1$HNMR (600 MHz, CDCl$_3$): δ(ppm)=7.84 (1H, Ar—H), 7.74-7.63 (2H, Ar—H), 2.13 (2H, CH$_2$), 1.24-1.05 (10H, 5CH$_2$), 0.86-0.74 (5H, CH$_2$, CH$_3$). As can be seen from the spectrum, the hydrogen atoms (H) on benzene ring of fluorene mainly range from 8 to 7 and mainly have two different peak positions, the hydrogen atoms (H) on alkyl chain range from 3 to 0.5, and the hydrogen atoms (H) on red phosphorescent Ir(piq)$_3$ are not included in integral due to the low content. Since only changing the content of less red phosphorescent Ir(piq)$_3$, the variation tendency of the spectrum of PF-Ir(piq)$_3$100 is the same as that of PF-Ir(piq)$_3$500.

The weight-average molecular weight of PF-Ir(piq)$_3$100 measured by gel permeation chromatography is 40.8K, the number-average molecular weight thereof is 9.3K, and the molecular weight distribution index thereof is 4.38. The glass transition temperature of the polymer is 155° C., and the polymer has three branches.

Embodiment 5

(1) Synthetic method of complex Ir(piqBr)$_3$ is the same as that of embodiment 1.

(2) Preparation of PF-Ir(piq)$_3$50 (50 represents that the molar percentage of the red phosphorescent Ir(piqBr)$_3$ in the whole polymer is 0.05 mol %) is as follows: Under nitrogen atmosphere, 642.6 mg (1 mmol) of 2,7-bis(4,4,5,5-tetramethyl-1,3-dioxo-2-boronalkyl)-9,9-dioctylfluorene as a reaction monomer, 547.6 mg (0.9985 mmol) of 2,7-dibromo-9,9-dioctylfluorene, and 1.04164 mg (0.001 mmol) of Ir(piqBr)$_3$ are added into 13.34 mL of toluene and stirred for 30 min to fully mix and become homogenous. 46.4 mg (0.04 mmol) of Pd(PPh$_3$)$_4$, 2 drops of Aliquat 336, and 6 mL of 2 mol/L K$_2$CO$_3$ solution are added into the mixed solution in turn, and followed by being stirred and slowly being heated to the refluxing temperature 94° C. and then the reaction is conducted for 48h. Whereafter, 20 mg of phenylboronic acid as an end-capping material is added and the reaction is conducted for 12h, after this, 0.2 mL of bromobenzene as an end-capping material is added and the reaction is conducted for another 12h. The solution after reaction is slowly poured into methanol being rapidly stirred to separate out the yellowish-white solid after cooling to room temperature, and then the yellowish-white solid is filtered and dried. The resulting solid is treated by Soxhlet extraction with acetone for 48 h, thereby obtaining a crude product, and then the crude product is purified by silica gel column chromatography (with an eluent, chloroform), thereby getting 475 mg of PF-Ir(piq)$_3$50 which is yellowish-white solid powder and of which yield is 61%.

Figure 3:
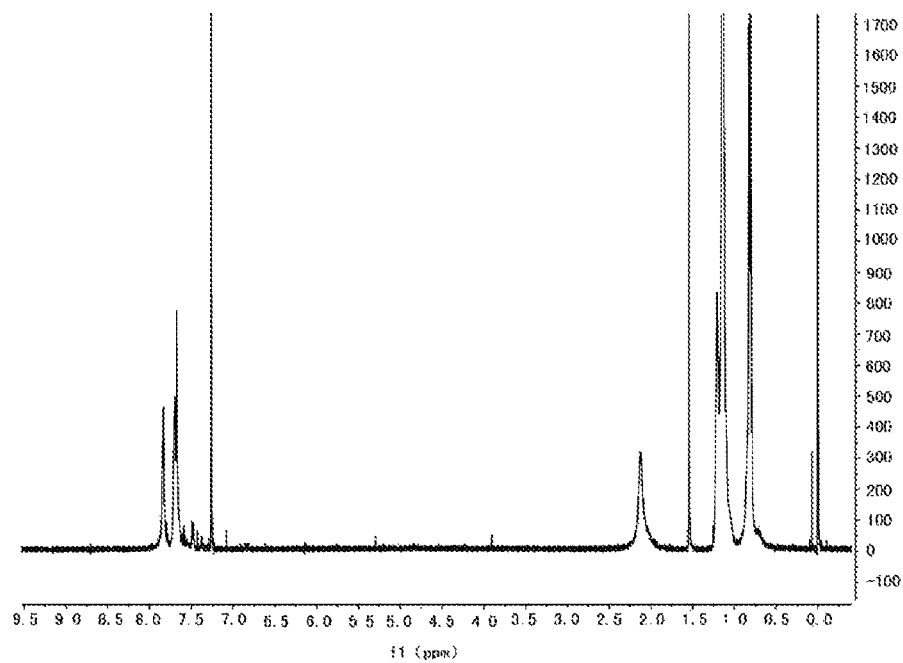
FIG. 3 shows the $^1$H NMR spectrum of PF-Ir(piq)$_3$50 polymer in embodiment 5.

$^1$HNMR spectral data of PF-Ir(piq)$_3$50 is shown in FIG. 3, $^1$HNMR (600 MHz, CDCl$_3$): δ(ppm)=7.84 (1H, Ar—H), 7.74-7.63 (2H, Ar—H), 2.13 (2H, CH$_2$), 1.24-1.05 (10H, 5CH$_2$), 0.86-0.74 (5H, CH$_2$, CH$_3$). As can be seen from the spectrum, the hydrogen atoms (H) of the polymer mainly are the hydrogen atoms (H) on benzene ring and the hydrogen atoms (H) on alkyl chain. The hydrogen atoms (H) on benzene ring mainly are between 8 and 7.5, the hydrogen atoms (H) on alkyl chain mainly are between 2.5 and 0.5, and the hydrogen atom (H) characteristic peaks are not obvious due to the low content of M complex.

The number-average molecular weight of PF-Ir(piq)$_3$50 measured by gel permeation chromatography is 11.1K, the weight-average molecular weight thereof is 23.0K, and the molecular weight distribution index is 2.06. The glass transition temperature of the polymer is 148° C., and the polymer has three branches.

Comparative Example 1

(1) Synthetic method of Ir(piqBr)$_3$ is the same as that of embodiment 1.

(2) Preparation of PF-Ir(piq)$_3$25 (25 represents that the molar percentage of the red phosphorescent Ir(piqBr)$_3$ in the whole polymer is 0.025 mol %) is as follows: Under nitrogen atmosphere, 642.6 mg (1 mmol) of 2,7-bis(4,4,5,5-tetramethyl-1,3-dioxo-2-boronalkyl)-9,9-dioctylfluorene as a reaction monomer, 547.6 mg (0.99925 mmol) of 2,7-dibromo-9,9-dioctylfluorene and 0.52082 mg (0.0005 mmol) of Ir(piqBr)$_3$ are added into 13.34 mL of toluene and stirred for 30 min to fully mix and become homogenous. 46.2 mg (0.04 mmol) of Pd(PPh$_3$)$_4$, 2 drops of Aliquat 336, and 6 mL of 2 mol/L K$_2$CO$_3$ solution are added into the mixed solution in turn, and followed by being stirred and slowly being heated to the refluxing temperature, and then the reaction is conducted for 48h. Whereafter, 20 mg of phenylboronic acid as an end-capping material is added and the reaction is conducted for 12h, and then 0.2 mL of bromobenzene as an end-capping material is added and the reaction is conducted for another 12h. The solution after reaction is slowly poured into methanol being rapidly stirred to separate out a greenish white solid after cooling to room temperature, and then the greenish white solid is filtered and dried. The resulting solid is treated by Soxhlet extraction with acetone for 48h, thereby obtaining a crude product, and then the crude product is purified by silica gel column chromatography (with an eluent, chloroform), thereby getting 555 mg of PF-Ir(piq)$_3$25 which is greenish white powder and of which yield is 71%.

$^1$HNMR spectral data of PF-Ir(piq)$_3$25 of the embodiment is as follows: $^1$HNMR (600 MHz, CDCl$_3$): δ(ppm)=7.84 (1H, Ar—H), 7.73-7.64 (2H, Ar—H), 2.12 (2H, CH$_2$), 1.25-1.02 (10H, 5CH$_2$), 0.90-0.73 (5H, CH$_2$, CH$_3$). It can be seen from the spectrum that the variation tendency of PF-Ir(piq)$_3$25 is the same as the variation tendencies of PF-Ir(piq)$_3$500 and PF-Ir(piq)$_3$100.

The number-average molecular weight of PF-Ir(piq)$_3$25 measured by gel permeation chromatography is 11.0K, the weight-average molecular weight thereof is 21.7K, and the molecular weight distribution index is 1.96. The glass transition temperature of the polymer is 133° C., and the polymer has three branches.

Embodiment 6

(1) Preparation of 2-(5-(4-bromo)phenyl-2H-1,2,4-triazol-3-yl)pyridine is as follows and has the reaction mechanism shown as following equation:

(a) Under nitrogen atmosphere, 10.4 g (0.1 mol) of 2-cyanopyridine and 5.5 g (0.11 mol) of hydrazine hydrate are added into 5 mL of ethanol, and stirred at room temperature overnight. After stopping the reaction, the solvent is dried by pumping, thereby separating out white needle-like crystals, and then the white needle-like crystals is washed with diethyl ether and filtered, thereby achieving 9.22 g of (2-pyridinyl)amino hydrazone in yield of 68%.

(b) 2.0 g (15 mmol) of (2-pyridinyl)amino hydrazone and 1.6 g (15 mmol) of anhydrous sodium carbonate are added into the mixture of 15 mL of dimethylacetamide (DMAC) and 5 mL of anhydrous tetrahydrofuran (THF), and followed by being evacuated, being introduced nitrogen and being stirred until room temperature. And then 3.27 g (15 mmol) of 4-bromobenzoyl chloride dissolved in 5 mL of DMAC is dropwise added into the mixed solution mentioned above, whereafter, the reaction is conducted in the ice bath for 2h and subsequently at room temperature for 3h. After stopping the reaction, washing with water, filtering, washing with ethanol and drying are conducted, thereby obtaining a grayish yellow solid. The solid is added into ethylene glycol, and slowly heated to 190° C. ,and then the reaction is conducted at 190° C. for 5h. After cooling to room temperature and washing with water, 1.86 g of 2-(5-(4-bromo)-phenyl-2H-1,2,4-triazol-3-yl)pyridine being a grayish white needle-like solid is achieved in 62% yield.

$^1$HNMR spectral data of the grayish white needle-like solid is as follows: $^1$HNMR (600 MHz, CDCl$_3$): δ(ppm)=12.21 (s, 1H), 8.72 (d, J=4.2 Hz, 1H), 8.30 (d, J=8.4 Hz, 1H), 8.10 (d, J=8.4 Hz, 2H), 7.90 (dt, J$_1$=7.8, J$_2$=1.8 Hz, 1H), 7.61 (d, J=8.4 Hz, 2H), 7.43 (dd, J$_1$=4.6 Hz, J$_2$=4.8 Hz, 3H). As can be seen from the $^1$H NMR spectrum, there is a active H for the ancillary ligands at 12.21 position, and the hydrogen atoms (H) at other positions is on benzene ring and thus between 9 and 7.

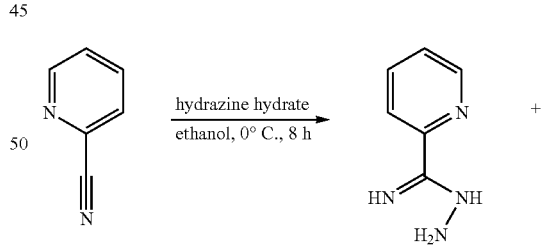

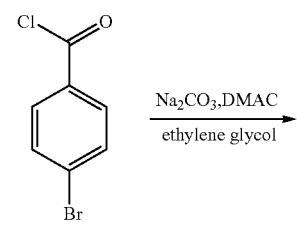

-continued

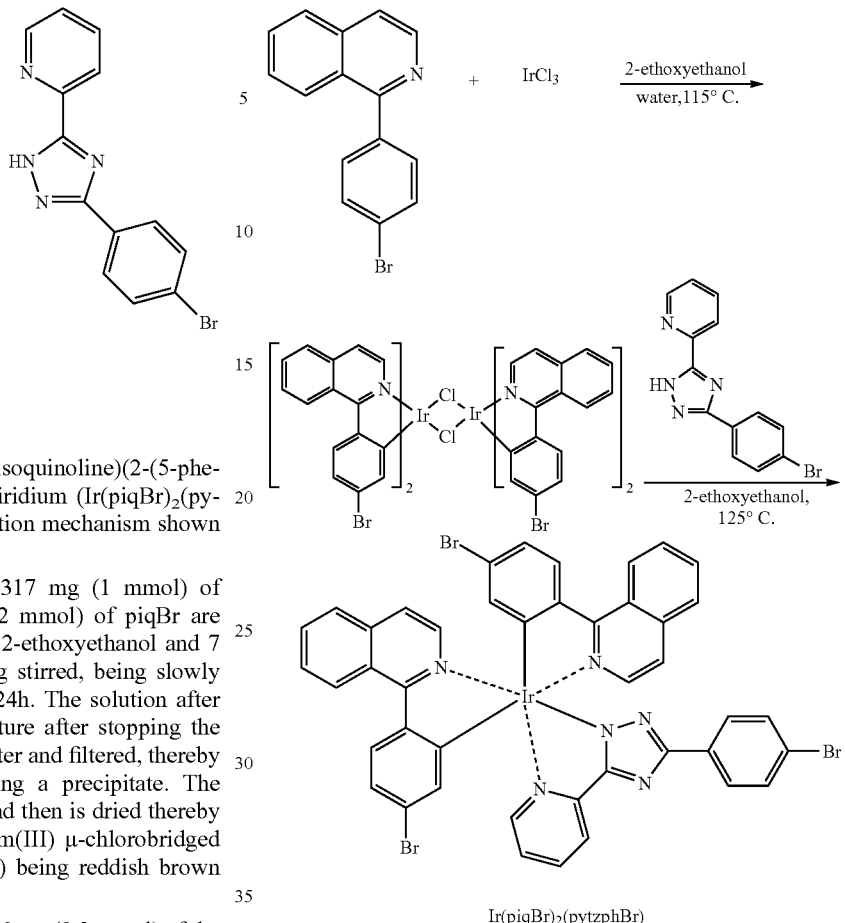

Ir(piqBr)₂(pytzphBr)

(2) Preparation of bis(2-phenyl-isoquinoline)(2-(5-phenyl-2H-1,2,4-triazol-3-yl)-pyridine) iridium (Ir(piqBr)₂(pytzphBr)) is as follows and has a reaction mechanism shown as following equation:

(a) Under nitrogen atmosphere, 317 mg (1 mmol) of iridium trichloride and 622 mg (2.2 mmol) of piqBr are dissolved in a mixture of 21 mL of 2-ethoxyethanol and 7 mL of water, and followed by being stirred, being slowly heated to 115° C. and reacting for 24h. The solution after reaction is cooled to room temperature after stopping the reaction, and then is washed with water and filtered, thereby obtaining a red crude product being a precipitate. The precipitate is washed with ethanol and then is dried thereby achieving the cyclometalated iridium(III) μ-chlorobridged dimer (Ir(III) chloride bridge dimer) being reddish brown solid powders.

(b) Under nitrogen atmosphere, 316 mg (0.2 mmol) of the cyclometalated iridium(III) μ-chlorobridged dimer (Ir(III) chloride bridge dimer), 97.7 mg (0.44 mmol) of 2-(5-(4-bromo)-phenyl-2H-1,2,4-triazole-3-yl) pyridine and 212 mg (2 mmol) of anhydrous sodium carbonate are dissolved in 16 mL of 2-ethoxyethanol, and followed by being stirred and slowly heated to 125° C., and reacting for 24h. A large amount of water is added into the solution after reaction cooled to room temperature to separate out a red solid after stopping the reaction, and then the red solid is filtered and dried. The resulting crude solid product is purified by silica gel column chromatography (with an eluent, dichloromethane/petroleum ether (1:6)), thereby achieving 262 mg of bis(2-phenyl-isoquinoline) (2-(5-phenyl-2H-1,2,4-triazol-3-yl)pyridine)iridium (Ir(piqBr)₂(pytzphBr)) being orangish red solid powders in 67% yield.

¹HNMR spectral data of (Ir(piqBr)₂(pytzphBr)) is as follows: ¹HNMR (600 MHz, (CD₃)₂OS): δ(ppm)=9.01-8.95 (m, 2H), 8.35 (d, J=8.4 Hz, 1H), 8.32 (d, J=8.4 Hz, 1H), 8.19 (d, J=8.4 Hz, 1H), 8.05-8.09 (m, 3H), 7.88-7.92 (m, 6H), 7.73 (d, J=6 Hz, 1H), 7.66 (dd, J=6.6 Hz, 1H), 7.64 (dd, J=6 Hz, 1H), 7.60 (d, J=6.6 Hz, 1H), 7.57 (d, J=6 Hz, 1H), 7.54 (d, J=8.4 Hz, 2H), 7.43 (ddd, $J_1$=7.2 Hz, $J_2$=5.4 Hz, $J_3$=1.2 Hz, 1H), 7.32 (dd, $J_1$=8.4 Hz, $J_2$=1.8 Hz, 1H), 7.25 (d, $J_1$=9 Hz, $J_2$=1.8 Hz, 1H), 6.39 (d, J=1.8 Hz, 1H), 6.29 (d, J=1.8 Hz, 1H). The elemental analysis result in theory is as follows: by percent (%), C, 48.79; H, 2.48; N, 7.94; the detecting result is as follows: by percent (%) C, 49.27; H, 2.86; N, 6.53. TOF-MS testing value is 1057.08, and calculated value is 1058.64.

(3) Preparation of PF-Ir(piq)₂(pytzph)500 (500 represents that the molar percentage of the red phosphorescent Ir(piq)₂(pytzph) in the whole polymer is 0.5 mol %) is as follows and has a reaction mechanism shown as following equation: Under nitrogen atmosphere, 642.6 mg (1 mmol) of 2,7-bis (4,4,5,5-tetramethyl-1,3-dioxo-2-boronalkyl)-9,9-dioctylfluorene as a reaction monomer, 540.2 mg (0.985 mmol) of 2,7-dibromo-9,9-dioctylfluorene and 10.59 mg (0.01 mmol) of Ir(piqBr)₂(pytzphBr) are added into 30 mL of toluene and stirred for 30 min to fully mix and become homogenous. Then, 46.4 mg (0.04 mmol) of Pd(PPh₃)₄, 2 drops of Aliquat 336 and 6 mL of 2 mol/L K₂CO₃ solution sequentially are added into the mixed solution, and followed by being stirred and slowly heated to the refluxing temperature 94° C., and reacting for 48h. Subsequently, 20 mg of phenylboronic acid as an end-capping material is added and the reaction is conducted for 12h, and then 0.2 mL of bromobenzene as an end-capping material is added and the reaction is conducted for another 12h. The solution after reaction cooled to room temperature is slowly poured into methanol being rapidly stirred to separate out a pinkish white solid after stopping the reaction, and then the pinkish white solid is filtered and dried. The resulting solid is treated by Soxhlet extraction with acetone for 48h, thereby obtaining a crude product, and then the crude product is purified by silica gel column chromatography (with eluent, chloroform), thereby getting 493 mg of PF-Ir(piq)₂(pytzph)500 being pinkish white solid powders in 63% yield.

¹HNMR spectral data of PF-Ir(piq)₂(pytzph)500 is as follows: ¹HNMR: (600 MHz, CDCl₃): δ(ppm)=7.882 (1H, Ar—H), 7.69-7.658 (2H, Ar—H), 2.153 (2H, CH$_2$), 1.270-1.097 (10H, 5CH$_2$), 0.877-0.812 (5H, CH$_2$, CH$_3$). It can be seen from the spectrum that PF-Ir(piq)$_2$(pytzph)500 has the same variation tendency with PF-Ir(piq)$_3$, because both of them belong to a polymer with polyfluorene system and the doping amount of red light as a core is too low.

The number-average molecular of PF-Ir(piq)$_2$(pytzph)500 measured by gel permeation chromatography is 15.6K, the weight-average molecular weight thereof is 37.0K, and the molecular weight distribution index is 2.25. The glass transition temperature of the polymer is 145° C., and the polymer has three branches.

mmol) of 2,7-dibromo-9,9-dioctylfluorene and 1.05864 mg (0.001 mmol) of Ir(piqBr)$_2$(pytzphBr) are added into 30 mL of toluene and stirred for 30 min to fully mix and become homogenous. Then, 46.4 mg (0.04 mmol) of Pd(PPh$_3$)$_4$, 2 drops of Aliquat 336 and 6 mL of 2 mol/L K$_2$CO$_3$ solution are added into the mixed solution sequentially, and followed by being stirred and slowly heated to the refluxing temperature 94° C., and reacting for 48h. Subsequently, 20 mg of phenylboronic acid as an end-capping material is added and the reaction is conducted for 12h, and then 0.2 mL of bromobenzene as an end-capping material is added and the reaction is conducted for another 12h. The solution after reaction cooled to room temperature is slowly poured into methanol being rapidly stirred to separate out a light yellow solid after stopping the reaction, and then the light yellow solid is filtered and dried. The resulting solid is treated by Soxhlet extraction with acetone for 48h, thereby obtaining a crude product, and then the crude product is purified by silica gel column chromatography (with an eluent, chloroform), thereby getting 381 mg of PF-Ir(piq)$_2$(pytzph)50 being light yellow solid powders in 49% yield.

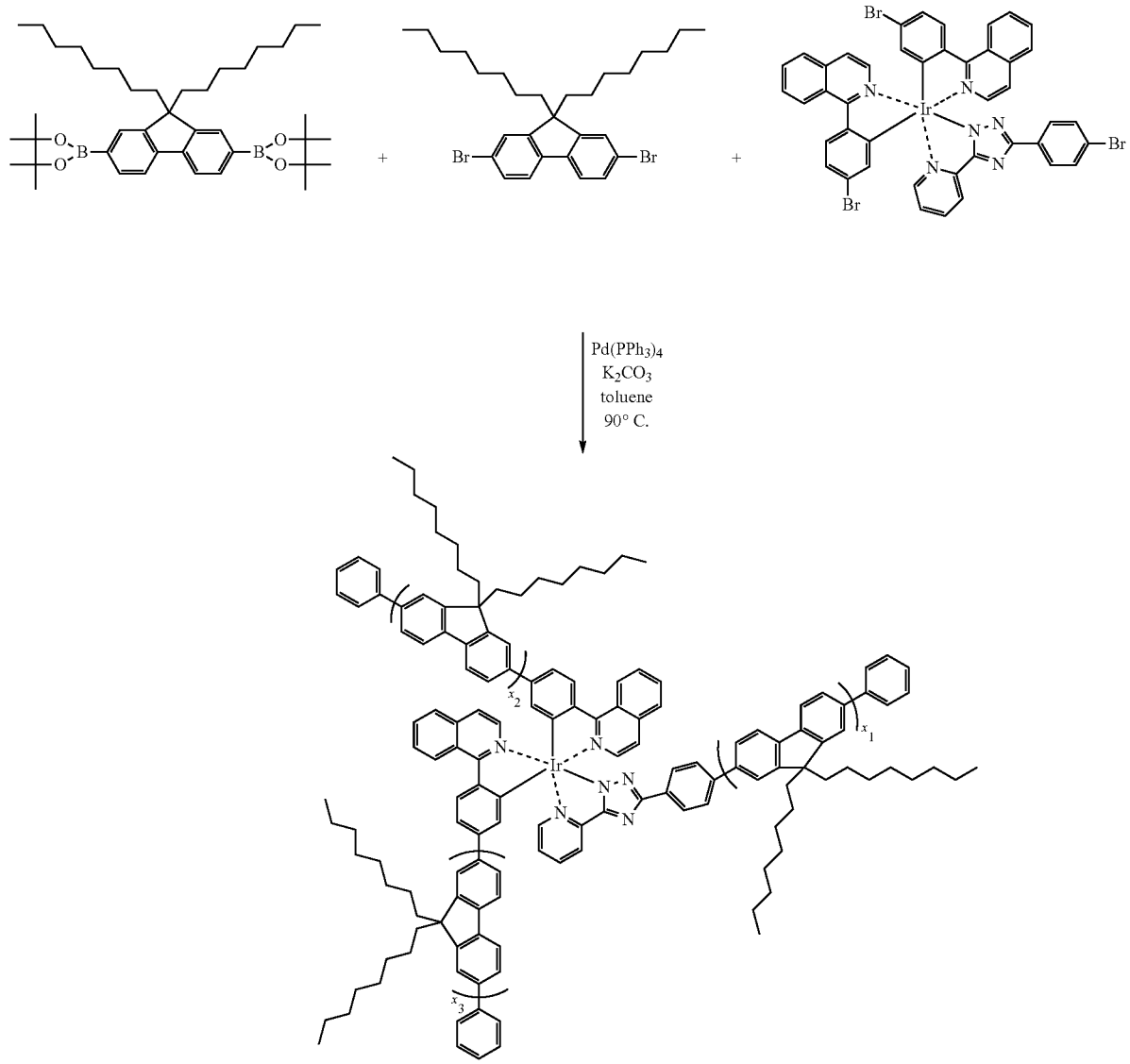

Embodiment 7

(1) Synthetic method of Ir(piqBr)$_2$(pytzphBr) is the same as that of embodiment 6;

(2) Preparation of PF-Ir(piq)$_2$(pytzph)50 (50 represents that the molar percentage of the red phosphorescent Ir(piq)$_2$(pytzph) in the whole polymer is 0.05 mol %) is as follows: Under the protection of nitrogen, 642.6 mg (1 mmol) of 2,7-bis(4,4,5,5-tetramethyl-1,3-dioxo-2-boronalkyl)-9,9-dioctylfluorene as a reaction monomer, 547.6 mg (0.9985

¹HNMR spectral data of PF-Ir(piq)₂(pytzph)50 is as follows: ¹HNMR: (600 MHz, CDCl₃): β(ppm)=7.84 (1H, Ar—H), 7.73-7.63 (2H, Ar—H), 2.13 (2H, CH₂), 1.26-1.04 (10H, 5CH₂), 0.90-0.73 (5H, CH₂, CH₃). It can be seen from the spectrum that PF-Ir(piq)₂(pytzph)50 has the same variation tendency with PF-Ir(piq)₃, because both of them belong to a polymer with polyfluorene system and the doping amount of red light emitting core is too low.

The number-average molecular weight of PF-Ir(piq)₂(pytzph)50 measured by gel permeation chromatography is 13.6K, the weight-average molecular weight thereof is 36.7K, and the molecular weight distribution index is 2.69. The glass transition temperature of the polymer is 153° C., and the polymer has three branches.

Embodiment 8

(1) Synthetic method of Ir(piqBr) is the same as that of embodiment 1;

(2) Preparation of 3,6-dibromo[9-(2-ethylhexyl)]carbazole is as follows and has a reaction mechanism shown as following equation: Under the protection of nitrogen, 16.3 g (50 mmol) of 3,6-dibromocarbazole and 9.7 g (50 mmol) of 2-ethylhexyl bromide (bromoisooctane) are dissolved in 100 mL of toluene, and stirred until fully dissolution. And then 4.8 g (15 mmol) of tetrabutyl ammonium bromide (TBAB), 40 mL of aqueous solution of KOH (22.4 g, 0. 4 mol) and 60 mL of toluene are added into the reaction solution in turn, and stirred for 8h at room temperature when the solution is milk white, and followed by being slowly heated to 130° C. when the solution becomes yolk yellow, and the reaction is conducted for 36h, the solution after reaction is cooled to room temperature. And then the solvent in the mixed solution is removed by rotary evaporation, and the resulting crude product is dissolved in CH₂Cl₂, washed with water and dried. After rotary evaporation, the crude product is purified by column chromatography on silica gel (with an eluent, petroleum ether: CH₂Cl₂ (5:1)), thereby obtaining 16.6 g of 3,6-dibromo [9-(2-ethylhexyl)]carbazole being a white needle-like crystal in 76% yield.

¹H NMR spectral data of 3,6-dibromo[9-(2-ethylhexyl)]carbazole being a white needle-like crystal is as follows: ¹HNMR: (600 MHz, (CD₃)₂SO): δ(ppm)=8.03 (d, J=1.8 Hz, 2H), 7.56 (dd, J₁=9 Hz, J₂=1.8 Hz, 2H), 7.15 (d, J=8.4 Hz, 2H), 3.81-3.93 (m, 2H), 1.94-2.03 (m, 1H), 1.27-1.44 (m, 8H), 0.91-1.02 (m, 6H). As shown in the ¹HNMR spectrum, the hydrogen atoms (H) on benzene ring of carbazole are between 8.5~7 which have three different peak positions due to the symmetry of benzene ring of carbazole. The hydrogen atoms (H) on the alkyl chain mainly are between 4~0.9.

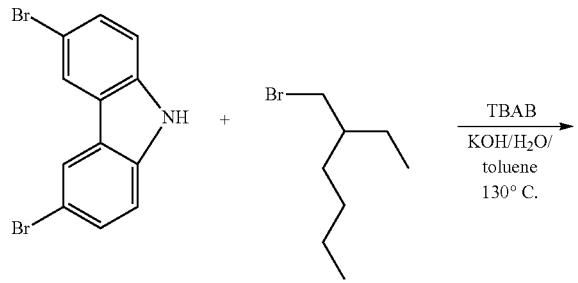

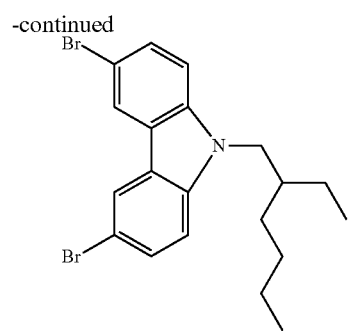

(3) Preparation of PFCz5000-Ir(piq)₃50 (5000 represents that the molar percentage of the isooctyl carbazole in the whole polymer is 5 mol %; and 50 represents that the molar percentage of the red phosphorescent Ir(piq)₃ in the whole polymer is 0.05 mol %): Under the protection of the nitrogen, 642.6 mg (1 mmol) of 2,7-bis (4,4,5,5-tetramethyl-1,3-dioxo-2-boronalkyl)-9,9-dioctylfluorene, 492.8 mg (0.8985 mmol) of 2,7-dibromo-9,9-dioctylfluorene, 43.8 mg (0.1 mmol) of 3,6-dibromo[9-(2-ethylhexyl)]carbazole and 1.04164 mg (0.001 mmol) of Ir(piqBr)₃ are added into the toluene and stirred for 30 min to fully mix and become homogenous. Then, 46.4 mg (0.04 mmol) of Pd(PPh₃)₄, two drops of Aliquat 336 and 6 mL of 2 mol/L K₂CO₃ solution are added into the mixed solution in turn, stirred and slowly heated to the refluxing temperature 94° C., and the reaction is conducted for 48h. Whereafter, 20 mg of phenylboronic acid as an end-capping material is added and the reaction is conducted for 12h, and then 0.2 mL of bromobenzene as an end-capping material is added and the reaction is conducted for another 12h. The solution after reaction is cooled to room temperature after stopping the reaction and then is slowly poured into methanol being rapidly stirred to separate out the solid, subsequently, the solid is filtered and dried. The resulting solid is treated by Soxhlet extraction with acetone for 48h, thereby obtaining a crude product. And then the crude product is purified by silica gel column chromatography (with an eluent, chloroform), thereby obtaining PFCz5000-Ir(piq)₃50 being solid powders.

Embodiment 9

(1) Synthetic method of Ir(piqBr)₃ is the same as that of embodiment 1;

(2) Preparation of 9-(6-bromohexyl)carbazole is as follows and has a reaction mechanism shown as following equation: Under the protection of nitrogen, 5.00 g (31 mmol) of carbazole and 70.00 g (300 mmol) of 1,6-dibromohexane are added into 80 mL of toluene. And then 0.5 g (15 mmol) of tetrabutyl ammonium bromide (TBAB) dissolved in 5 mL of deionized water and 15 mL of 2 mol/L aqueous solution of KOH are poured into the reaction system. The mixture is extracted by dichloromethane after stopping the reaction, and then the resulting organic phase is washed with deionized water, dried with anhydrous magnesium sulfate and filtered, and subsequently, the solvent is evaporated under reduced pressure. The resulting crude product is purified by silica gel column chromatography (with an eluent, petroleum ether:dichloromethane:absolute alcohol (20:2:1)), thereby obtaining 8.50 g of 9-(6-bromohexyl)carbazole being a needle-like white solid in 56% yield.

¹H NMR spectral data of 9-(6-bromohexyl)carbazole is as follows: ¹H NMR (CDCl₃): δ(ppm)=8.10 (ddd, J₁=7.8 Hz, J₂=1.2 Hz, J₃=0.6 Hz, 2H), 7.46 (dt, J₁=7.8 Hz, J₂=6.6 Hz, J₃=1.2 Hz, 2H), 7.40 (dt, J₁=7.8 Hz, J₂=J₃=0.6 Hz, 2H), 7.23 (ddd, J₁=7.8 Hz, J₂=7.2 Hz, J₃=1.2 Hz, 2H), 4.32 (t, J=7.2

Hz, 2H), 3.36 (t, J=6.6 Hz, 2H), 1.82-1.90 (m, 4H), 1.41-1.48 (m, 4H). As shown in the spectrum, the four hydrogen atoms (H) on carbazole at different positions are located between 8.5~7, which belong to H on benzene ring; and the hydrogen atoms (H) on alkyl chain are located between 4.5~1.

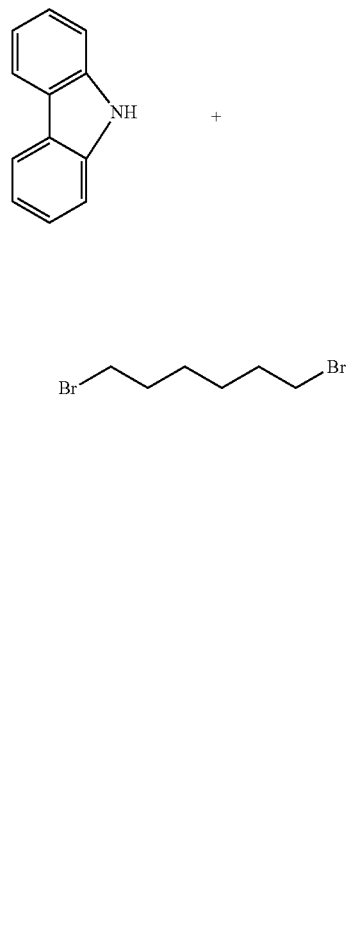

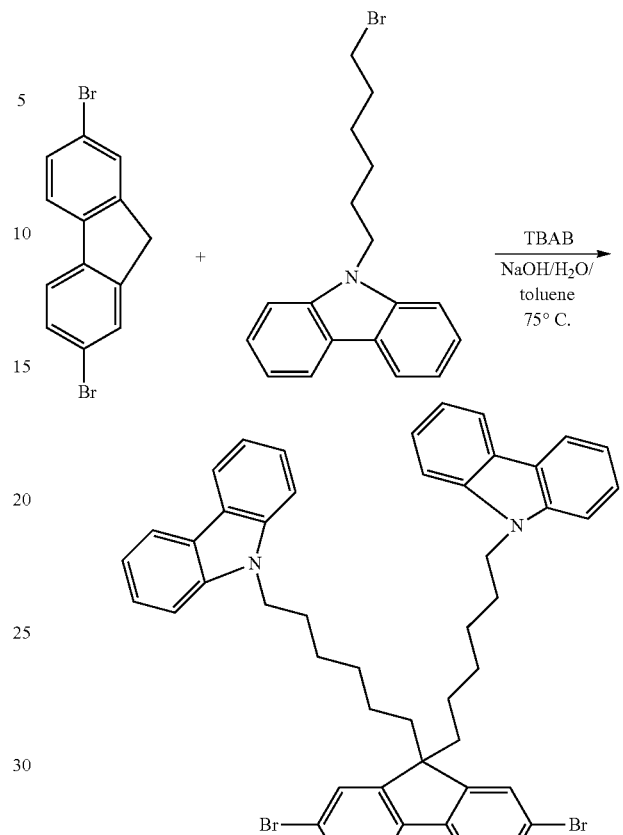

(3) Preparation of 9,9-bis(9-(6-hexyl)carbazole)-2,7-dibromofluorene is as follows and has a reaction mechanism shown as following equation: Under the protection of nitrogen, 4.86 g (15 mmol) of 2,7-dibromofluorene and 9.9 g (30 mmol) of 9-(6-bromohexyl)carbazole are dissolved in 100 mL of toluene in a three-neck flask, and then 0.322 g (1 mmol) of tetrabutyl ammonium bromide and 30 mL of NaOH (4.0 g, 0.1 mol)) aqueous solution are added in the state of stirring and stirred for another 30 min. Whereafter, the mixture is slowly heated to 75° C. and reacts for 24h, and followed by being cooled to room temperature. Toluene in the solution cooled is removed by rotary evaporation, after that, the resulting crude product is dissolved in $CH_2Cl_2$, is washed with water and dried, and then the solvent is removed by rotary evaporation. The resulting product is purified by the silica gel column chromatography with hexane and $CH_2Cl_2$ as eluents, thereby achieving 9,9-bis(9-(6-hexyl)carbazole)-2,7-dibromofluorene.

(4) Preparation of PFFCz5000-Ir(piq)$_3$50 (5000 represents that the molar percentage of 9,9-bis(9-(6-hexyl)carbazole)-2,7-dibromofluorene in the whole polymer is 5 mol %; and 50 represents that the molar percentage of the red phosphorescent Ir(piq)$_3$ in the whole polymer is 0.05 mol %) is as follows: Under the protection of nitrogen gas, 642.6 mg (1 mmol) of 2,7-bis(4,4,5,5-tetramethyl-1,3-dioxo-2-boronalkyl)-9,9-dioctylfluorene as a reaction monomer, 492.8 mg (0.8985 mmol) of 2,7-dibromo-9,9-dioctylfluorene, 82.3 mg (0.1 mmol) of 9,9-bis(9-(6-hexyl)carbazole)-2,7-dibromofluorene, and 1.04164 mg (0.001 mmol) of Ir(piqBr)$_3$ are added into toluene and stirred for 30 min to fully mix and become homogenous. And then, 46.4 mg (0.04 mmol) of Pd(PPh$_3$)$_4$, two drops of Aliquat 336 and 6 mL of 2 mol/L K$_2$CO$_3$ aqueous solution are added into the mixed solution in turn, and followed by being stirred, being slowly heated to the refluxing temperature 94° C. and reacting for 48h. Subsequently, 20 mg of phenylboronic acid as an end-capping material is added and the reaction is conducted for 12h, and then 0.2 mL of bromobenzene as an end-capping material is added and the reaction is conducted for another 12 h. After stopping the reaction, the solution is cooled to the room temperature and slowly poured into methanol being rapidly stirred to separate out a solid, and then the solid is filtered and dried. The resulting solid is treated by Soxhlet extraction using acetone for 48h, thereby obtaining a crude product. The crude product is purified by column chromatography on silica gel (with an eluent, chloroform), thereby obtaining PFFCz5000-Ir(piq)$_3$50 being solid powers.

Embodiment 10

(1) Synthetic method of Ir(piqBr)$_3$ is the same as that of embodiment 1;

(2) Preparation of 9,9-bis(2-ethylhexyl)-2,7-dibromofluorene is as follows: Under nitrogen gas atmosphere, 4.86 g (15 mmol) of 2,7-dibromofluorene and 5.79 g (30 mmol) of bromoisooctane are dissolved in 60 mL of toluene in a three-neck flask and stirred until being dissolved. Then, 0.322 g (1 mmol) of tetrabutyl ammonium bromide and 30 mL of NaOH (4.0 g, 0.1 mol)) aqueous solution are added into the three-neck flask and stirred for 30 min, and followed by being slowly heated to 75° C. and reacting for 24h, and then being cooled to the room temperature. The toluene in solution cooled is removed by rotary evaporation. The resulting crude product is dissolved in CH$_2$Cl$_2$, washed with water and dried, and then the solvent is removed by rotary evaporation. The resulting product is purified by the column chromatography on silica gel (with eluents, n-hexane and CH$_2$Cl$_2$), thereby obtaining 9,9-bis(2-ethylhexyl)-2,7-dibromofluorene.

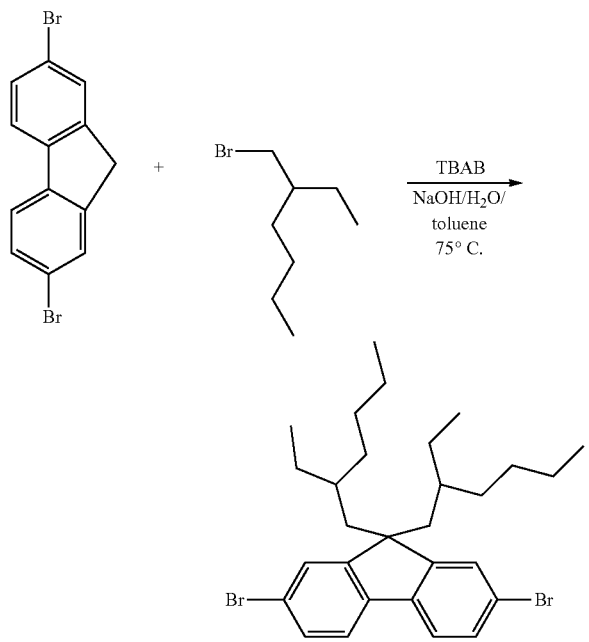

(3) Preparation of PFF-Ir(piq)$_3$50 (50 represents that the molar percentage of the red phosphorescent Ir(piq)$_3$ in the whole polymer is 0.05 mol %) is as follows: Under the protection of nitrogen gas, 642.6 mg (1 mmol) of 2,7-bis(4,4,5,5-tetramethyl-1,3-dioxo-2-boronalkyl)-9,9-dioctyl-fluorene, 547.6 mg (0.9985 mmol) of 2,7-dibromo-9,9-(2-ethylhexyl)fluorene and 1.04164 mg (0.001 mmol) of Ir(piqBr)$_3$ are added into toluene and stirred for 30 min to fully mix and become homogenous. Then, 46.4 mg (0.04 mmol) of Pd(PPh$_3$)$_4$, two drops of Aliquat 336 and 6 mL of 2 mol/L K$_2$CO$_3$ aqueous solution are added into the reaction solution in turn, and followed by being stirred and slowly heated to the refluxing temperature, and reacting for 48h. Whereafter, 20 mg of phenylboronic acid as an end-capping material is added and the reaction is conducted for 12h, and then 0.2 mL of bromobenzene as an end-capping material is added and the reaction is conducted for another 12h. After stopping the reaction, the reaction solution is cooled to the room temperature and slowly poured into methanol being rapidly stirred to separate out a solid, and then the solid is filtered and dried. The resulting solid is treated with acetone by Soxhlet extraction for 48h, thereby obtaining a crude product. The crude product is purified by column chromatography on silica gel (with an eluent, chloroform), thereby obtaining PFF-Ir(piq)$_3$50 being solid powers.

Application Example 1

PF-Ir(piq)$_3$50 generated from embodiment 5 is dissolved in chloroform to prepare chloroform solutions with different concentrations of PF-Ir(piq)$_3$50 ($10^{-3}$ mol/L, $10^{-4}$ mol/L, $10^{-5}$ mol/L, $10^{-6}$ mol/L, $10^{-7}$ mol/L), photoluminescence (PL) spectra (namely photoluminescence spectra) of each solution are measured using Fluoromax-4 fluorescence spectrograph produced by HORIBA Jobin Yvon company from France.

Figure 4:
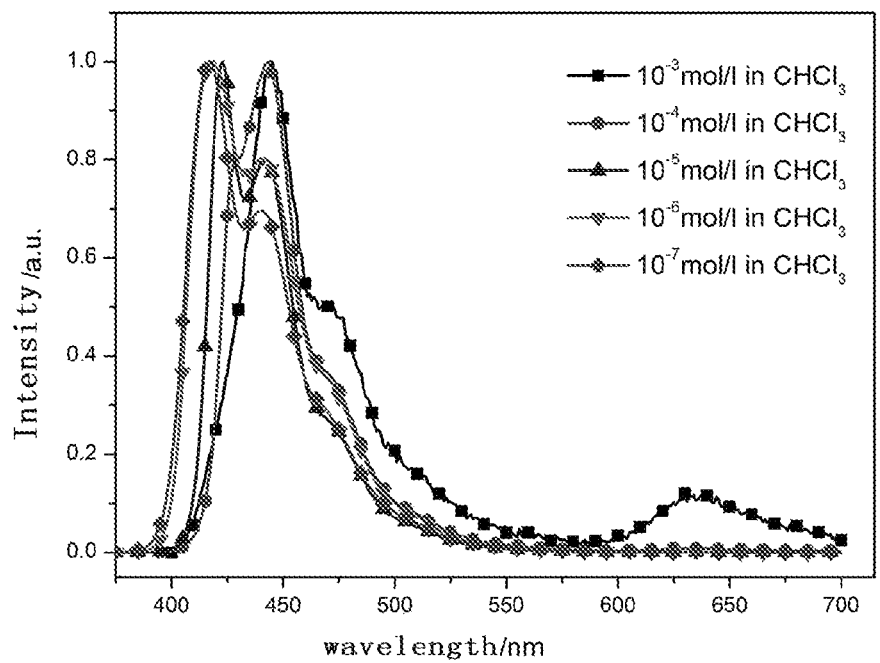
FIG. 4 shows the PL spectra of the solution of PF-Ir(piq)$_3$50 polymer of embodiment 5 in chloroform solutions with different concentrations.

FIG. 4 shows the PL spectra of chloroform solutions with different concentrations of PF-Ir(piq)$_3$50. As can be seen from FIG. 4, the polymer has three main emission peaks which are located at 417 nm, 445 nm and 632 nm respectively. With increase of concentration of the polymer, the emission peak at 417 nm has a red-shift, and the intensity of the emission peak at 445 nm enhances. When the concentration is up to $10^{-4}$ mol/L, the peak at 445 nm becomes the maximum emission peak. The red emission is not be detected at low concentration. When the concentration is increased to $10^{-3}$ mol/L, the red emission peak comes out.

The polymer is dissolved in chloroform, to obtain a chloroform solution with the concentration of 10 mg/mL, and then the solution is spin-coated on the quartz glass to prepare a thin film. The ultraviolet-visible (UV-Vis) absorption spectrum and the PL spectrum of the thin film are measured to characterize photophysical performance of the polymer in the state of thin film.

Figure 5:
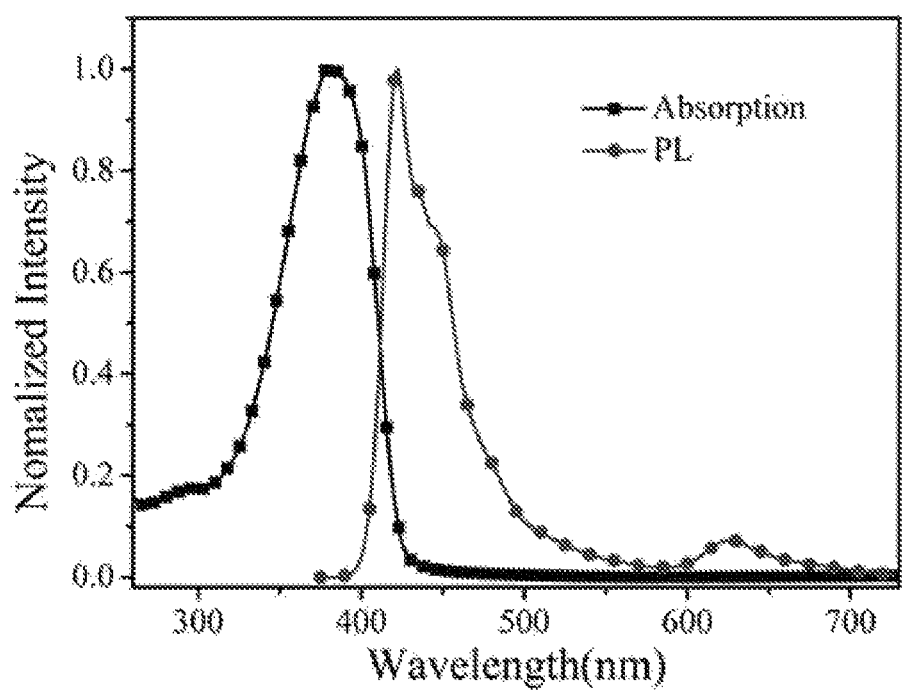
FIG. 5 shows the UV and PL spectra of PF-Ir(piq)$_3$50 polymer of embodiment 5 the state of films.

FIG. 5 shows the UV-Vis absorption spectrum and the PL spectrum of PF-Ir(piq)$_3$50 prepared by embodiment 5 in the state of thin film. The maximum absorption peak for the polymer in the state of thin film is located at 382 nm and the maximum emission peak thereof is located at 422 nm. There is a small emission band at 625 nm which belongs to the red emission peak of Ir complex.

By analyzing the photophysical performance of the hyperbranched polymer PF-Ir(piq)$_3$50, the UV-Vis absorption spectrum and PL spectrum of this system have been investigated, which facilitate the fabrication of the organic electroluminescent devices.

Application Example 2

The organic electroluminescent device with the structure of ITO/PEDOT: PSS (50 nm)/polymer (80 nm)/TPBi (40 nm)/LiF (1 nm)/Al (100 nm) is fabricated using the PF-Ir(piq)$_3$500 obtained from embodiment 1. The electroluminescent spectra and color coordination of the device are measured by Spectral Scanning Colorimeter PR655 produced by American CROWNTECH to characterize the electroluminescent performance of the polymer.

The organic electroluminescent device mentioned above is fabricated by spin-coating process, the detailed process is as follows: poly(3,4-ethylenedioxythiophene)-poly(styrenesulphonate) (PEDOT:PSS) is spin-coated on the ITO glass to form a hole transporting layer with the thickness of 50 nm, and followed by being annealed for 10 min at 120° C. Then the polymer is dissolved in toluene to prepare toluene solution with the concentration of 10 mg/mL, and subsequently the organic film with the thickness of about 80 nm is prepared at the rotate speed of 2000 r/min The organic film is annealed at 100° C. for 15 min. Finally, by vacuum evaporation, 1,3,5-tris(1-phenyl-1H-benzo[d]imidazol-2-yl) benzene (TPBi) (40 nm) used as an material of a electron-transporting layer with the thickness of 40 nm, LiF used as an electron-transporting material with the thickness of 1 nm, and Al used as a cathode with the thickness of 100 nm are evaporated in sequence onto the ITO glass which is coated with light emitting material and is heat-treated.

Figure 6:
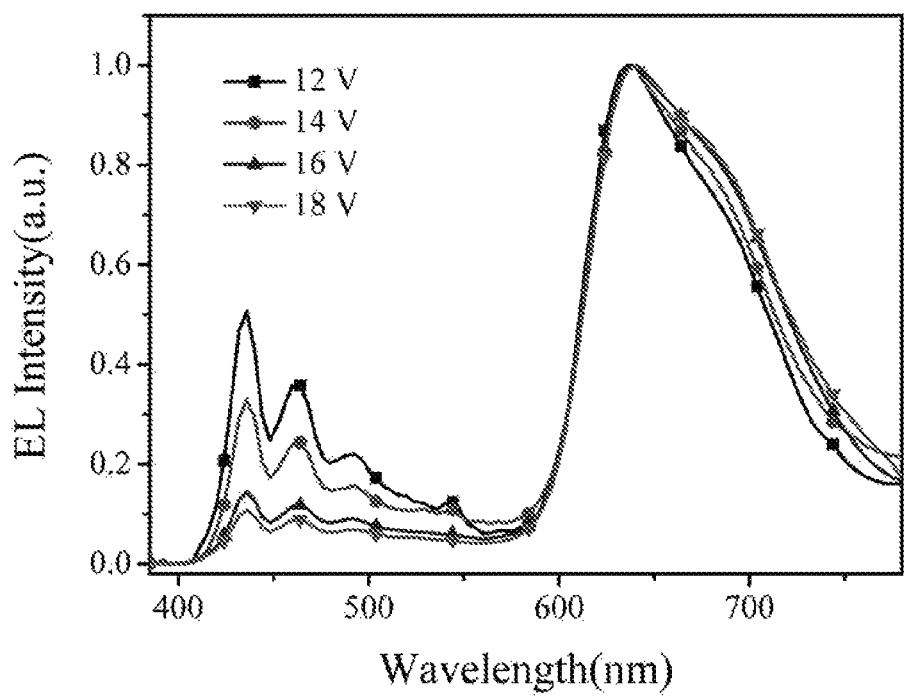
FIG. 6 shows the electroluminescent spectra of the organic electroluminescent devices prepared from PF-Ir(piq)$_3$500 at different voltages in application example 2.

FIG. 6 shows the electroluminescent spectra of the organic electroluminescent device prepared from the present application example at different voltages. As shown in the figure, the emission peaks are mainly dominated by red emission and the intensity of blue emission is weak. The obtained spectra belong to warm white light.

Application Example 3

The organic electroluminescent device with the structure of ITO/PEDOT: PSS (50 nm)/polymer (80 nm)/TPBi (40 nm)/LiF (1 nm)/Al (100 nm) is fabricated using PF-Ir(piq)$_3$100 obtained from embodiment 4. The preparation of the device is the same as that of application example 2.

Figure 7:
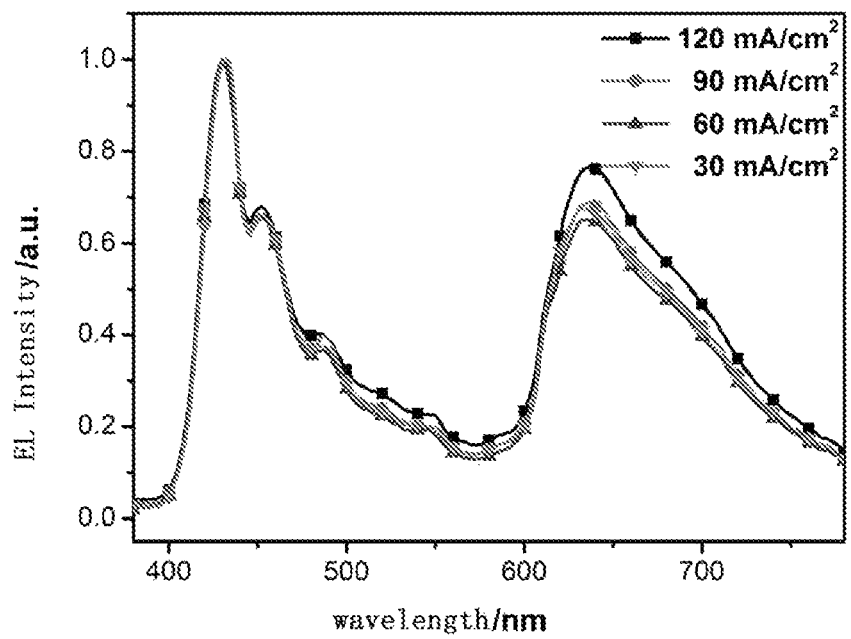
FIG. 7 shows the electroluminescent spectra of the organic electroluminescent devices prepared from PF-Ir(piq)$_3$100 at different current density in application example 3.

FIG. 7 shows the electroluminescent spectra of the organic electroluminescent device prepared in the present application example at different voltages. As shown in the figure, the electroluminescent spectra cover the range of 410 nm-780 nm which contains the whole visible light region, and the color coordination is (0.30, 0.23) which is close to the pure white light of (0.33, 0.33).

Figure 8:
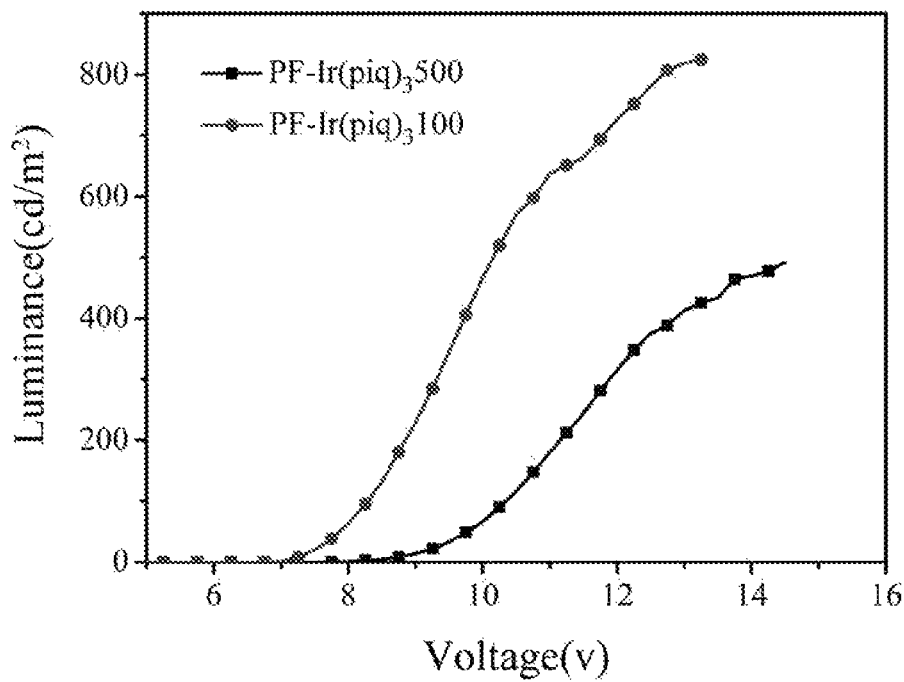
FIG. 8 shows the voltage-luminance curve of organic electroluminescent devices in application examples 2 and 3.

FIG. 8 provides the voltage-luminance curves of the organic electroluminescent devices fabricated in Application examples 2 and 3. As shown in the figure, the turn-on voltage of PF-Ir(piq)$_3$500 is 7.5V and the maximum luminance is 492 cd/m$^2$; and the turn-on voltage of PF-Ir(piq)$_3$100 is 7.0V and the maximum luminance is 824 cd/m$^2$.

Application Example 4

The organic electroluminescent device with the structure of ITO/PEDOT: PSS (50 nm)/polymer (80 nm)/TPBi (40 nm)/Ba (4 nm)/Al (100 nm) is fabricated using PF-Ir(piq)$_3$50 obtained from embodiment 5. The preparation of the device is the same as that of Application example 2.

The electroluminescent properties of the device are as follows: the turn-on voltage is 7.5V, the maximum luminance is 779 cd/m$^2$, and the maximum electroluminescent efficiency is 3.08 cd/A. The electroluminescent spectra cover the range of 420 nm to 780 nm which contains the whole visible light region. And the color coordination is (0.28, 0.23).

Application Example 5

The organic electroluminescent device with the structure of ITO/PEDOT: PSS (50 nm)/polymer (80 nm)/TPBi (40 nm)/Ba (4 nm)/Al (100 nm) is fabricated using PF-Ir(piq)$_3$25 obtained from comparative example 1. The preparation of the device is the same as that of application example 2.

The electroluminescent properties of the device are as follows: The turn-on voltage is 7.3V, the maximum luminance is 607 cd/m$^2$, and the maximum electroluminescent efficiency is 0.99 cd/A. The electroluminescent spectra cover the range of 420~780 nm which basically contains the whole visible light; and the color coordination is (0.22, 0.19).

Application Example 6

The organic electroluminescent device with the structure of ITO/PEDOT: PSS (50 nm)/polymer (80 nm)/TPBi (40 nm)/LiF (1 nm)/Al (100 nm) is fabricated using PF-Ir(piq)$_2$(pytzph)500 obtained from embodiment 6. The preparation of the device is the same as that of application example 2 except for the following process. The toluene solution in which the concentration of the polymer is 12 mg/mL is prepared, and then the organic film with the thickness of about 85 nm is prepared at the rotate speed of 2000 r/min.

Figure 9:
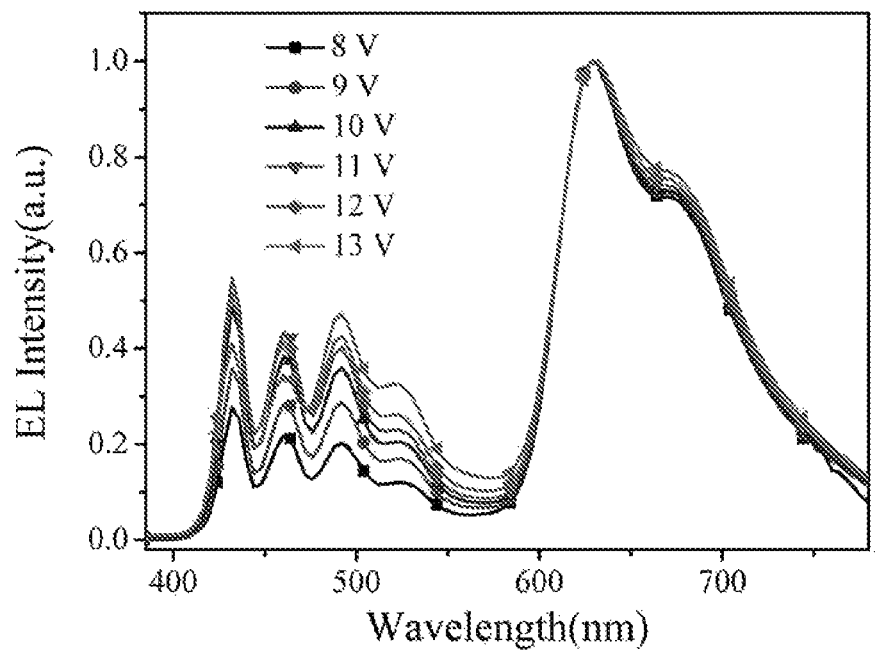
FIG. 9 shows the electroluminescent spectra of the organic electroluminescent devices prepared from PF-Ir(piq)$_2$(pytzph)500 at different voltages in application example 6.

FIG. 9 shows the electroluminescent spectra of the organic electroluminescent device prepared in the present application example at different voltages. As shown in the figure, when the content of red complexes is high, the blue emitting is weak, and the main emission peak is located at the red position of 628 nm. It means that the energy could be efficiently transferred from blue fluorescent materials to red core; and the color coordination seems slight red which belongs to reddish white light.

Application Example 7

The organic electroluminescent device with the structure of ITO/PEDOT: PSS (50 nm)/polymer (80 nm)/TPBi (40 nm)/LiF (1 nm)/Al (100 nm) is fabricated using PF-Ir(piq)$_2$(pytzph)50 obtained from embodiment 7. The preparation of the device is the same as that of application example 5. The toluene solution in which the concentration of the polymer is 12 mg/mL is prepared, and then the organic film with the thickness of about 85 nm is prepared at the rotate speed of 2000 r/min.

Figure 10:
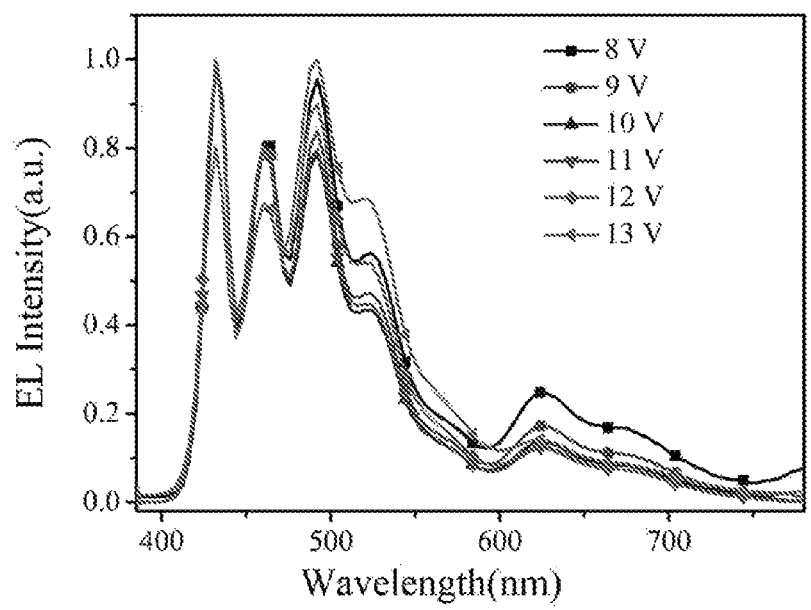
FIG. 10 shows the electroluminescent spectra of the organic electroluminescent devices prepared from PF-Ir(piq)$_2$(pytzph)50 at different voltages in application example 7.

FIG. 10 shows the electroluminescent spectra of the organic electroluminescent device prepared from PF-Ir(piq)$_2$(pytzph)50 at different voltages. As shown in the figure, the electroluminescent spectra mainly covers the whole visible light range of 410 nm~780 nm and the light belongs to bluish white light.

Figure 11:
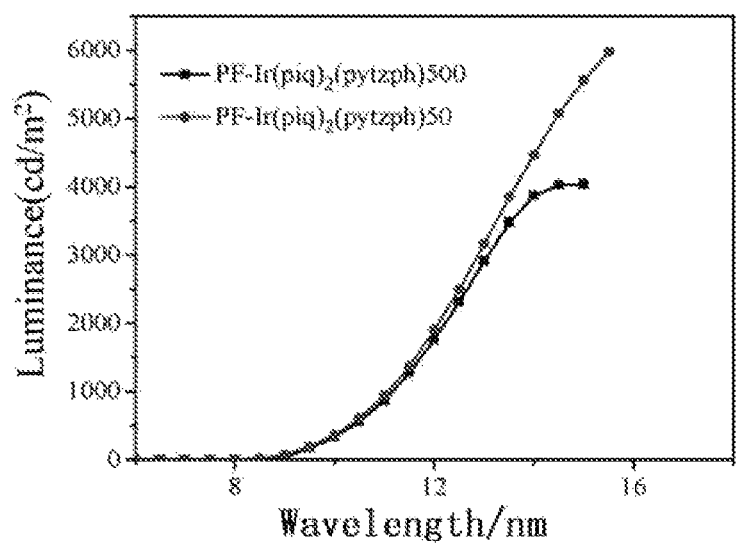
FIG. 11 shows the voltage-luminance curve of the organic electroluminescent devices in application example 6 and 7.

FIG. 11 provides the voltage-luminance curves of the organic electroluminescent devices fabricated from PF-Ir(piq)$_2$(pytzph)500 and PF-Ir(piq)$_2$(pytzph)50. As shown in the figure, the turn-on voltage of PF-Ir(piq)$_2$(pytzph)500 is 8.5V, and the maximum luminance thereof is 4039 cd/m$^2$; the turn-on voltage of PF-Ir(piq)$_2$(pytzph)50 is 8.0V, and the maximum luminance thereof is 5976 cd/m$^2$.

The invention claimed is:

1. A white-light hyperbranched conjugated polymer, comprising a red phosphorescent Ir(III) complex as a core and two or more blue fluorescent materials as a framework, the white-light hyperbranched conjugated polymer having a structure formula represented by formula (I):

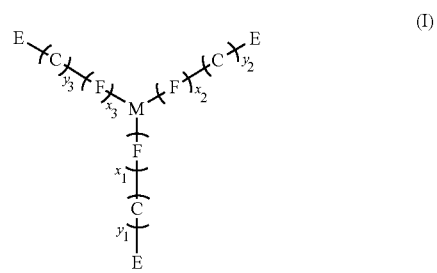

wherein:

M represents the red phosphorescent Ir(III) complex Ir(piq)₃ or Ir(piq)₂(pytzph), the Ir(piq)₃ has a structure formula

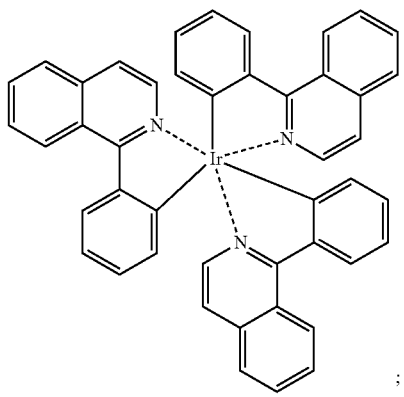
;

the Ir(piq)₂(pytzph) has a structure formula

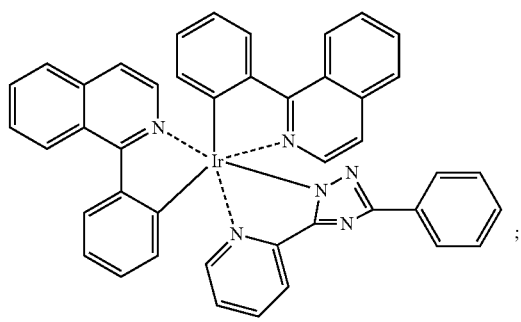
;

F and C respectively represent two different blue fluorescent materials,

E represents an end-capping group, x and y respectively represent a monomer number of the two different blue fluorescent materials, x equaling $x_1+x_2+x_3$ is a positive integer, y equaling $y_1+y_2+y_3$ is a natural number which is zero, the content of the red phosphorescent Ir(III) complex M in the hyperbranched polymer is in the range of 0.05 to 0.5 mol %;

the weight-average molecular weight of the white light hyperbranched polymer is in the range of 10K to 150K;

the number-average molecular weight of the white light hyperbranched polymer is in the range of 7K to 30K;

the molecular weight distribution index of the white light hyperbranched polymer is more than 1 and no more than 6;

the hyperbranched polymer has three branched chains;

the glass transition temperature of the hyperbranched polymer is in the range of 120° C. to 200° C.;

the blue fluorescent material F is a fluorene derivative monomer having a structure general formula (II):

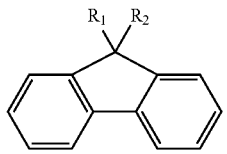
(II)

wherein: $R_1$ and $R_2$ independently are an alkyl group with the number of carbon atom selected in the range of 1 to 16;

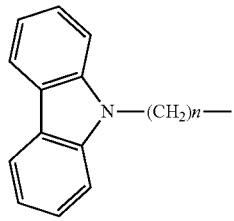
, n = 2~6;

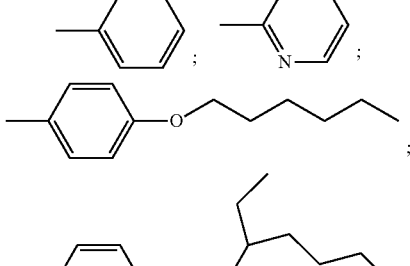

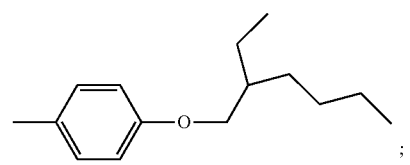

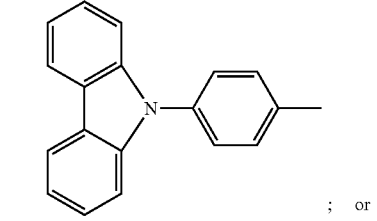
; or

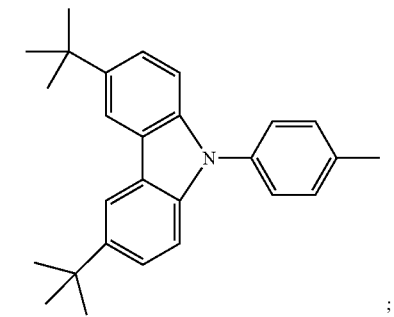
;

and $R_1$ and $R_2$ are same or different; and the blue fluorescent material C is a carbazole derivative having a structure general formula (III):

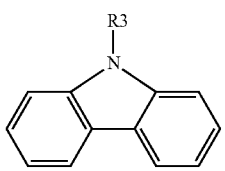

wherein: R₃ is an alkyl group with the number of carbon atom selected in the range of 2 to 16;

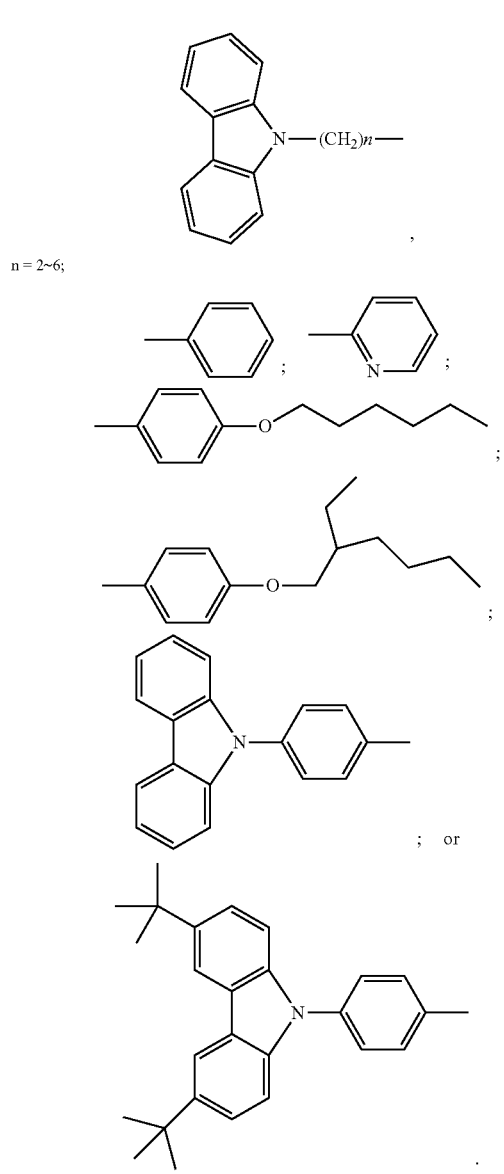

$n = 2\sim 6$;

2. The white-light hyperbranched conjugated polymer according to claim 1, characterized in that:
the content of the red phosphorescent Ir(III) complex M in the hyperbranched polymer is in the range of 0.05 to 0.2 mol %.

3. A method for preparing the white-light hyperbranched conjugated polymer according to claim 2, comprising:
conducting a Suzuki reaction using raw materials represented by structure general formulas 1), 2) and 3), thereby obtaining the white-light hyperbranched conjugated polymer;
wherein:
the raw material represented by structure general formula 1) is (MBr₃), a bromide of the red phosphorescent Ir(III) complex M;
the raw materials represented by the structure general formula 2) are derivatives of a fluorene reaction monomer represented by formulas (IV) and (V):

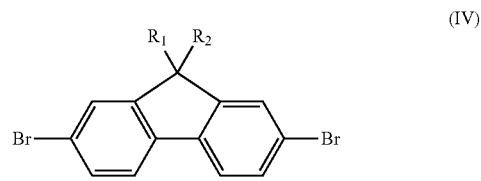

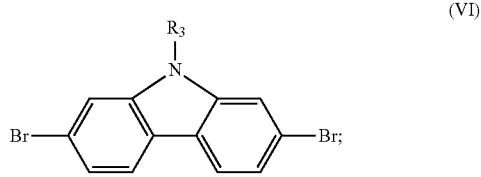

and
the raw material represented by the structure general formula 3) is a derivative of a carbazole reaction monomer represented by formula (VI):

with respect to the four raw materials,
the mole ratio of the bromide of the red phosphorescent Ir(III) complex M represented by MBr₃, the derivative of fluorene reaction monomer represented by formula (IV), the derivative of fluorene reaction monomer represented by formula (V), and the derivative of carbazole reaction monomer represented by formula (VI) is 1:0~998.5:300~1000:0, and the mole sum of the derivative of fluorene reaction monomer represented by formula (IV) and the derivative of carbazole reaction monomer represented by formula (VI) is less than the mole number of the derivative of fluorene reaction monomer represented by formula (V).

4. The white-light hyperbranched conjugated polymer according to claim 1, characterized in that:
the blue fluorescent material F is 9,9-dioctylfluorene.

5. A method for preparing the white-light hyperbranched conjugated polymer according to claim 4, comprising:
conducting a Suzuki reaction using raw materials represented by structure general formulas 1), 2) and 3), thereby obtaining the white-light hyperbranched conjugated polymer;

wherein:
  the raw material represented by structure general formula 1) is MBr₃, a bromide of the red phosphorescent Ir(III) complex M;
  the raw materials represented by the: structure general formula 2) are derivatives of a fluorene reaction monomer represented by formulas (IV) and (V):

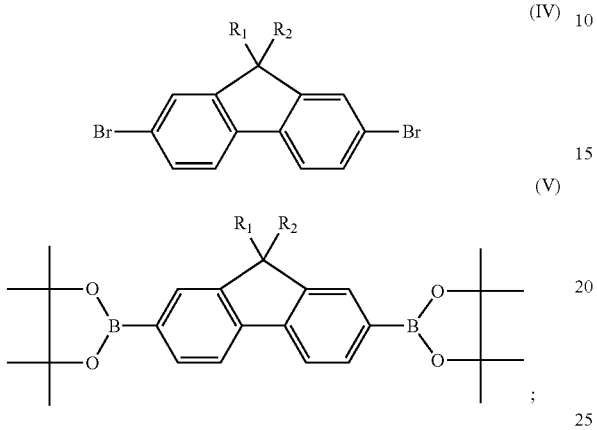

(IV)

(V)

and
  the raw material represented by the structure general formula 3) is a derivative of a carbazole reaction monomer represented by formula (VI):

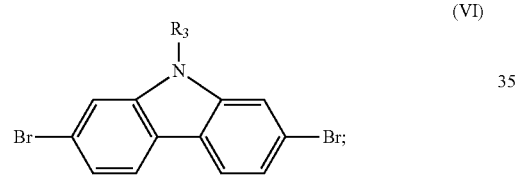

(VI)

with respect to the four raw materials,
  the mole ratio of the bromide of the red phosphorescent Ir(III) complex M represented by MBr₃, the derivative of fluorene reaction monomer represented by formula (IV), the derivative of fluorene reaction monomer represented by formula (V), and the derivative of carbazole reaction monomer represented by formula (VI) is 1:0~998.5:300~1000:0, and the mole sum of the derivative of fluorene reaction monomer represented by formula (IV) and the derivative of carbazole reaction monomer represented by formula (VI) is less than the mole number of the derivative of fluorene reaction monomer represented by formula (V).

6. The white-light hyperbranched conjugated polymer according to claim 1, characterized in that:
  the end-capping group E is phenyl, α-naphthyl or β-naphthyl.

7. A method for preparing the white-light hyperbranched conjugated polymer according to claim 6, comprising:
  conducting a Suzuki reaction using raw materials represented by structure general formulas 1), 2) and 3), thereby obtaining the white-light hyperbranched conjugated polymer;
  wherein:
    the raw material represented by structure general formula 1) is MBr₃, a bromide of the red phosphorescent Ir(III) complex M;
    the raw materials represented by the structure general formula 2) are derivatives of a fluorene reaction monomer represented by formulas (IV) and (V):

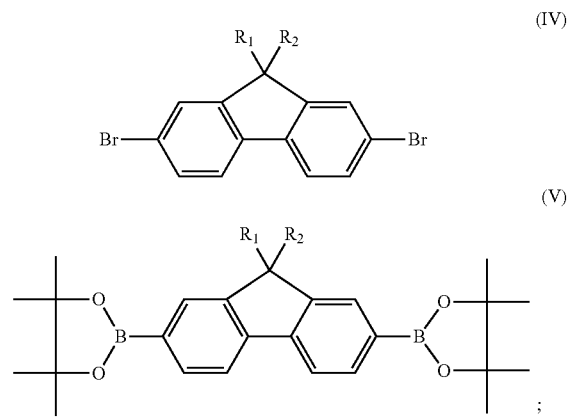

(IV)

(V)

and
  the raw material represented by the structure general formula is a derivative of a carbazole reaction monomer represented by formula (VI):

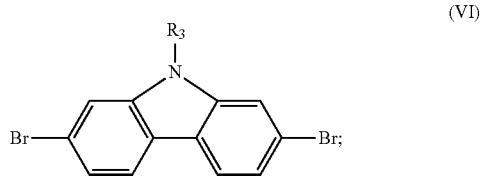

(VI)

with respect to the four raw materials,
  the mole ratio of the bromide of the red phosphorescent Ir(III) complex M represented by MBr₃, the derivative of fluorene reaction monomer represented by formula (IV), the derivative of fluorene reaction monomer represented by formula (V), and the derivative of carbazole reaction monomer represented by formula (VI) is 1:0~998.5:300~1000:0, and the mole sum of the derivative of fluorene reaction monomer represented by formula (IV) and the derivative of carbazole reaction monomer represented by formula (VI) is less than the mole number of the derivative of fluorene reaction monomer represented by formula (V).

8. A method for preparing the white-light hyperbranched conjugated polymer according to claim 1, comprising:
  conducting a Suzuki reaction using raw materials represented by structure general formulas 1), 2) and 3), thereby obtaining the white-light hyperbranched conjugated polymer;
  wherein:
    the raw material represented by structure general formula 1) is MBr₃, a bromide of the red phosphorescent Ir(III) complex M;
    the raw materials represented by the structure general formula 2) are derivatives of a fluorene reaction monomer represented by formulas (IV) and (V):

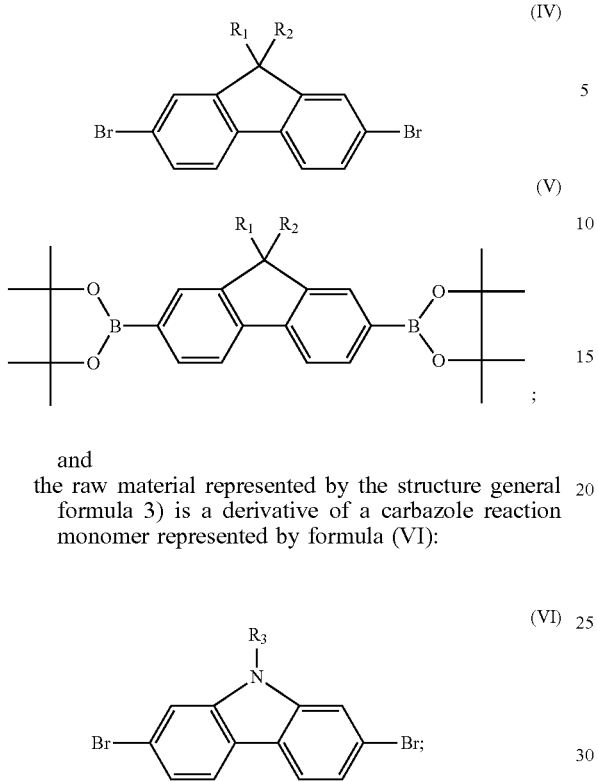

and the raw material represented by the structure general formula 3) is a derivative of a carbazole reaction monomer represented by formula (VI):

with respect to the four raw materials,
the mole ratio of the bromide of the red phosphorescent Ir(III) complex M represented by MBr$_3$, the derivative of fluorene reaction monomer represented by formula (IV), the derivative of fluorene reaction monomer represented by formula (V), and the derivative of carbazole reaction monomer represented by formula (VI) is 1:0~998.5:300~1000:0, and the mole sum of the derivative of fluorene reaction monomer represented by formula (IV) and the derivative of carbazole reaction monomer represented by formula (VI) is less than the mole number of the derivative of fluorene reaction monomer represented by formula (V).

9. The preparing method according to claim 8, characterized in that:
the Suzuki reaction is conducted under the protection of inert gas by:
firstly adding four raw materials of the derivatives of fluorene reaction monomer represented by formulas (IV) and (V), the derivative of carbazole reaction monomer represented by formula (VI) and the bromide of the red phosphorescent Ir(III) complex M represented by MBr$_3$ with different mole ratios into toluene solvent, and stirring to uniformly mix;
afterwards adding tetrakis(triphenylphosphine)palladium catalyst (Pd(PPh$_3$)$_4$), methyl trioctyl ammonium chloride as a phase transfer catalyst and K$_2$CO$_3$ aqueous solution, stirring, heating to the refluxing temperature, and reacting for 48~60 h; and
finally adding end-capping materials with the end-capping group E, and reacting, thereby obtaining a reacting solution comprising the white-light hyperbranched conjugated polymer;

wherein:
with respect to the four raw materials, the mole ratio of the bromide of the red phosphorescent Ir(III) complex M represented by MBr$_3$ to the other three blue light emitting raw materials is 1:200~2000.

10. The preparing method according to claim 9, characterized by further comprising:
a post-processing method on the reaction solution comprising the white-light hyperbranched conjugated polymer, said post-processing method comprising:
slowly pouring the reaction solution containing the white-light hyperbranched conjugated polymer cooled to room temperature into a methanol solution being rapidly stirred to separate out a solid,
filtering and drying the solid,
treating the filtered and dried solid with acetone by Soxhlet extraction for 48~72h, thereby obtaining a crude product, and
treating the crude product by column chromatography with chloroform or tetrahydrofuran as an eluent, thereby obtaining the white-light hyperbranched conjugated polymer in the form of solid powders with different colors according to the content of the red phosphorescent Ir(III) complex M.

11. The preparing method according to claim 8, characterized in that:
the mole percentage of tetrakis(triphenylphosphine)palladium (Pd(PPh$_3$)$_4$) to a functional group participating in the Suzuki reaction is in the range of 1 mol % to 3 mol %.

12. The preparing method according to claim 8, characterized in that:
the bromide of the red phosphorescent Ir(III) complex M represented by MBr$_3$ is synthesized by a method comprising:
firstly placing 1-(4-bromophenyl)-isoquinoline as the main ligand monomer and Iridium(III) trichloride trihydrate with the molar ratio of 2~2.5:1 into a first solvent system, performing reflux and reacting at 100~140° C. under the protection of inert gas, thereby obtaining cyclometalated iridium(III) μ-chlorobridged dimer of 1-(4-bromophenyl)-isoquinoline; and
afterwards reacting the cyclometalated iridium(III) μ-chlorobridged dimer of 1-(4-bromophenyl)-isoquinoline and 3-(4-bromophenyl)-5-(2-pyridyl)-1,2,4-triazole according to the mole ratio of 1:2~2.5 at 100~200° C. in a second solvent system under the protection of inert gas in the presence of an anhydrous alkali metal carbonate or silver trifluoroacetate as a catalyst, thereby obtaining the bromide of red phosphorescent Ir(III) complex M (MBr$_3$).

13. The preparing method according to claim 8, characterized in that:
the reaction of adding the end-capping materials with the end-capping group E is conducted by a method comprising:
firstly adding a boride of the end-capping group E and reacting for 12 h, and
afterwards adding a bromide of the end-capping group E and reacting for another 12 h;
wherein:
the boride of the end-capping group E is phenylboronic acid, α-naphthylboronic acid or β-naphthylboronic acid;
the bromide of end capping group E is bromobenzene, α-bromonaphthalene or β-bromonaphthalene;

the percentage of the boride of the end-capping group E to the four raw materials is in the range of 1 to 3 wt %; and the percentage of the bromide of the end-capping group F to the four raw materials is in the range of 10 wt% to 35 wt %.

14. An organic electroluminescent device, comprising the white-light hyperbranched conjugated polymer according to claim 1.

15. The organic electroluminescent device according to claim 14, characterized in that:
the device comprises a light emitting layer, and
the light emitting layer comprises the white-light hyperbranched conjugated polymer.

* * * * *